United States Patent
Wada et al.

(10) Patent No.: US 10,742,193 B2
(45) Date of Patent: Aug. 11, 2020

(54) ACOUSTIC WAVE FILTER DEVICE, RF FRONT-END CIRCUIT, AND COMMUNICATION APPARATUS

(71) Applicant: Murata Manufacturing Co., Ltd., Kyoto (JP)

(72) Inventors: Takaya Wada, Kyoto (JP); Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/355,978

(22) Filed: Mar. 18, 2019

(65) Prior Publication Data

US 2019/0214969 A1    Jul. 11, 2019

Related U.S. Application Data

(63) Continuation of application No. PCT/JP2017/033140, filed on Sep. 13, 2017.

(30) Foreign Application Priority Data

Sep. 26, 2016    (JP) .................... 2016-187480

(51) Int. Cl.
*H03H 9/64* (2006.01)
*H03H 9/60* (2006.01)
(Continued)

(52) U.S. Cl.
CPC ...... *H03H 9/6483* (2013.01); *H03H 9/02007* (2013.01); *H03H 9/0542* (2013.01);
(Continued)

(58) Field of Classification Search
CPC .......... H03H 9/02007; H03H 9/02834; H03H 9/0542; H03H 9/0557; H03H 9/14541;
(Continued)

(56) References Cited

U.S. PATENT DOCUMENTS 9,246,536 B2 *   1/2016   Caron ..................... H04B 1/52
2002/0180562 A1  12/2002  Taniguchi
(Continued)

FOREIGN PATENT DOCUMENTS

JP    H09-172340 A    6/1997
JP    H11-312944 A    11/1999
(Continued)

OTHER PUBLICATIONS

International Search Report for International Application No. PCT/JP2017/033140 dated Nov. 28, 2017.
(Continued)

*Primary Examiner* — Barbara Summons
(74) *Attorney, Agent, or Firm* — Pearne & Gordon LLP

(57) ABSTRACT

A filter includes a series-arm resonator located on a path that connects an input/output terminal (11m) with an input/output terminal (11n), and a first parallel-arm resonant circuit connected between a node, which is located on the path, and ground. The first parallel-arm resonant circuit includes a parallel-arm resonator, and a pair of a capacitor and a switch connected in parallel with each other and in series with the parallel-arm resonator between the parallel-arm resonator and ground. An interconnect line (a1) is connected to the input/output terminal (11m), and an interconnect line (a2) is connected to the input/output terminal. The parallel-arm resonator and the switch are connected by an interconnect line (a3). The interconnect line (a3) has a characteristic impedance lower than a characteristic impedance of the interconnect line (a1) or a characteristic impedance of the interconnect line (a2).

20 Claims, 12 Drawing Sheets

(51) Int. Cl.
*H03H 9/02* (2006.01)
*H03H 9/54* (2006.01)
*H03H 9/05* (2006.01)
*H03H 9/56* (2006.01)
*H03H 9/72* (2006.01)
*H03H 9/145* (2006.01)

(52) U.S. Cl.
CPC .......... *H03H 9/0557* (2013.01); *H03H 9/542* (2013.01); *H03H 9/568* (2013.01); *H03H 9/605* (2013.01); *H03H 9/64* (2013.01); *H03H 9/6403* (2013.01); *H03H 9/72* (2013.01); *H03H 9/02834* (2013.01); *H03H 9/14541* (2013.01); *H03H 2009/02173* (2013.01)

(58) Field of Classification Search
CPC ........ H03H 9/542; H03H 9/568; H03H 9/605; H03H 9/64; H03H 9/6403; H03H 9/6483; H03H 9/70; H03H 9/703; H03H 9/72; H03H 2009/02173
USPC .......................................... 333/193, 195, 133
See application file for complete search history.

(56) References Cited

U.S. PATENT DOCUMENTS

2009/0201104 A1    8/2009   Ueda et al.
2009/0251235 A1   10/2009   Belot et al.
2011/0234333 A1    9/2011   Tsukahara
2019/0214970 A1*   7/2019   Horita ................. H04B 1/0458

FOREIGN PATENT DOCUMENTS

| JP | 2002-314372 A  | 10/2002 |
| JP | 2003-332882 A  | 11/2003 |
| JP | 2009-207116 A  | 9/2009  |
| JP | 2011-199725 A  | 10/2011 |
| KR | 2002-0065837 A | 8/2002  |

OTHER PUBLICATIONS

Written Opinion for International Application No. PCT/JP2017/033140 dated Nov. 28, 2017.
Notification of Preliminary Rejection for Korean Patent Application No. 10-2019-7008241 dated May 29, 2020.

* cited by examiner

ACOUSTIC WAVE FILTER DEVICE, RF FRONT-END CIRCUIT, AND COMMUNICATION APPARATUS

This is a continuation of International Application No. PCT/JP2017/033140 filed on Sep. 13, 2017 which claims priority from Japanese Patent Application No. 2016-187480 filed on Sep. 26, 2016. The contents of these applications are incorporated herein by reference in their entireties.

BACKGROUND

Technical Field

The present disclosure relates to an acoustic wave filter device with a resonator, a radio frequency (RF) front-end circuit, and a communication apparatus.

In related art, acoustic wave filter devices employing acoustic waves are widely used for components such as a bandpass filter placed at the front-end section of a mobile communication apparatus. To meet the demand for increasingly complex operations such as multimode/multiband operations, RF front-end circuits or communication apparatuses equipped with a plurality of acoustic wave filter devices have been put into practical use.

Known examples of acoustic wave filter devices designed for multiband operations include acoustic wave filter devices configured as described below. In these acoustic wave filter devices, the parallel-arm resonant circuit (parallel-arm resonator) of a ladder filter including a bulk acoustic wave (BAW) resonator is connected in series with a pair of a capacitor and a switching element connected in parallel with each other (see, for example, Patent Document 1). Such an acoustic wave filter device constitutes a frequency-tunable acoustic wave filter whose pass band is tunable in response to switching of a switch between conduction and non-conduction.

Patent Document 1: U.S. Patent Application Publication No. 2009/0251235

BRIEF SUMMARY

The frequency-tunable acoustic wave filter device according to the related art mentioned above has the following problem. That is, if the impedance of an interconnect line connecting the parallel-arm resonator with the switch is equal to or higher than the impedance of an interconnect line connected to an input/output terminal of the acoustic wave filter device, the standing wave generated in the stop band located above the pass band of the acoustic wave filter device increases in amplitude, leading to degradation of attenuation characteristics.

Accordingly, the present disclosure provides a frequency-tunable acoustic wave filter device, an RF front-end circuit, and a communication apparatus that are capable of providing improved attenuation characteristics on the higher side of the pass band.

According to an aspect of the present disclosure, there is provided an acoustic wave filter device that is tunable in frequency, the acoustic wave filter device including a series-arm resonant circuit located on a path that connects a first input/output terminal with a second input/output terminal, and a first parallel-arm resonant circuit connected between a first node and ground, the first node being located on the path. The first parallel-arm resonant circuit includes a first parallel-arm resonator, and a pair of a first impedance element and a first switch connected in parallel with each other and in series with the first parallel-arm resonator between the first parallel-arm resonator and ground. A first interconnect line is connected to the first input/output terminal on the path. A second interconnect line is connected to the second input/output terminal on the path. The first parallel-arm resonator and the first switch are connected by a third interconnect line. A third impedance is lower than at least one of a first impedance and a second impedance, the third impedance being the characteristic impedance of the third interconnect line, the first impedance being the characteristic impedance of the first interconnect line, the second impedance being the characteristic impedance of the second interconnect line.

With regard to the above-mentioned configuration, a higher value of the third impedance results in increased amplitude of a standing wave generated in the stop band located on the higher side of the pass band of the acoustic wave filter device. This leads to degradation of attenuation characteristics. By contrast, by setting the third impedance lower than at least one of the first impedance and the second impedance, the amplitude of this standing wave decreases, thus making it possible to improve the attenuation characteristics on the higher side of the pass band.

In another possible configuration, the third impedance is lower than both the first impedance and the second impedance.

According to the above-mentioned configuration, the third impedance is lower than both the first impedance and the second impedance. This makes it possible to further lower the third impedance and consequently reduce the amplitude of the above-mentioned standing wave, thus further improving the attenuation characteristics on the higher side of the pass band.

In another possible configuration, the third impedance is less than or equal to 40Ω.

Consequently, as a result of the third impedance being lower than 40Ω, the amplitude of the above-mentioned standing wave decreases. This makes it possible to provide an attenuation of, for example, 45 dB or more in the stop band located on the higher side of the pass band.

In another possible configuration, the acoustic wave filter device further includes a wiring board. A portion of at least one of the first interconnect line, the second interconnect line, and the third interconnect line is disposed on the wiring board or inside the wiring board.

With regard to the above-mentioned configuration, if, for example, a portion of the first interconnect line connecting the first parallel-arm resonator with the first switch is disposed on the wiring board or inside the wiring board, it is possible to adjust the width of the first interconnect line disposed on the wiring board or inside the wiring board. Such adjustment of the width of the first interconnect line allows for easy setting of the characteristic impedance of the first interconnect line. The same is true for a case where a portion of the second interconnect line or a portion of the third interconnect line is disposed on the wiring board or inside the wiring board. In this case as well, adjusting the width of the second interconnect line or the width of the third interconnect line allows for easy setting of the characteristic impedance of the second interconnect line or the third interconnect line.

In another possible configuration, the first parallel-arm resonator and the first switch are disposed on the wiring board or inside the wiring board.

Consequently, as a result of the first parallel-arm resonator and the first switch being disposed on the wiring board or inside the wiring board, the first parallel-arm resonator and the first switch are integrated with each interconnect line. This enables miniaturization of the acoustic wave filter device.

In another possible configuration, the third interconnect line is provided in or on a layer provided with a control interconnect line, or in or on a layer provided with a power supply interconnect line, the control interconnect line connecting the first switch with a control circuit that controls the first switch, the power supply interconnect line connecting the first switch with a power supply circuit that drives the first switch.

Since the third impedance of the third interconnect line is lower than at least one of the first impedance of the first interconnect line and the second impedance of the second interconnect line, the distance between the third interconnect line and ground needs to be made shorter than at least one of the distance between the first interconnect line and ground and the distance between the second interconnect line and ground.

The power supply interconnect line connecting the first switch with the power supply circuit used for driving the first switch, and the control interconnect line connecting the first switch with the control circuit used for controlling the first switch do not affect filter characteristics. Therefore, to achieve lower profile of the wiring board, it is desired to reduce the distance between ground and the layer that is provided with the power supply interconnect line and the control interconnect line (referred to as SW power supply layer hereinafter).

Accordingly, by providing the third interconnect line in or on a layer of the wiring board that is provided with the control interconnect line used for controlling the first switch or with the power supply interconnect line for the first switch, it is possible to achieve both reduced distance between the third interconnect line and ground and lower profile of the wiring board.

If the third interconnect line is provided in or on the SW power supply layer, noise generated from each of the power supply circuit and the control circuit affects the third interconnect line. In this regard, the first parallel-arm resonator connected to the third interconnect line is designed to exhibit high impedance in the pass band of the acoustic wave filter device, and thus the noise is blocked by the first parallel-arm resonator.

This configuration ensures that even if the third interconnect line is provided in or on the SW power supply layer, the RF signal passing through the acoustic wave filter device is not affected by the noise from each of the control interconnect line and the power supply interconnect line, thus allowing for miniaturization and lower profile.

In another possible configuration, the acoustic wave filter device further includes a first inductor element located on a path that connects a node with ground via the first switch, the node being connected to the first parallel-arm resonator and the first impedance element.

In this regard, the acoustic wave filter device is formed by the series-arm resonant circuit and the first parallel-arm resonant circuit and has first bandpass characteristics and second bandpass characteristics that differ in pass band depending on whether the first switch is in a conducting state or in a non-conducting state. For example, when the first switch is in a conducting state, the first inductor element is selected by the first switch, and the resulting circuit configuration is such that a parallel circuit of the first impedance element and the first inductor element is connected in series with the first parallel-arm resonator. The bandpass characteristics in this state define the first bandpass characteristics.

When the first switch is in a non-conducting state, the first inductor element is not connected to the first parallel-arm resonator, and the resulting circuit configuration is such that the first parallel-arm resonator and the first impedance element are connected in series. The bandpass characteristics in this state define the second bandpass characteristics different from the first bandpass characteristics. The stop band on the lower side of the pass band in each of the first bandpass characteristics and the second bandpass characteristics is created by the resonant frequency at which the impedance of the first parallel-arm resonant circuit has a local minimum. That is, the above-mentioned configuration ensures that when the first switch is switched from non-conduction to conduction, the presence of the first inductor element makes it possible to increase the amount of downward shift of the stop band located on the lower side of the pass band in the first bandpass characteristics.

In another possible configuration, the acoustic wave filter device further includes a second parallel-arm resonant circuit connected between the first node and ground and in parallel with the first parallel-arm resonant circuit. The second parallel-arm resonant circuit includes a second parallel-arm resonator. The first parallel-arm resonator has a resonant frequency different from the resonant frequency of the second parallel-arm resonator.

Consequently, in the parallel-arm circuit formed by a parallel connection of the first parallel-arm resonant circuit and the second parallel-arm resonant circuit, at least one frequency at which the impedance has a local minimum and at least one frequency at which the impedance has a local maximum both shifts lower or higher in response to switching of the first switch between conduction and non-conduction. Therefore, for the first bandpass characteristics and the second bandpass characteristics, the attenuation slope determined by each of the frequency at which the impedance of the parallel-arm circuit has a local minimum and the frequency at which the impedance has a local maximum shifts lower or higher while maintaining its steepness. Consequently, with the configuration according to the above-mentioned aspect, as the first switch is switched between conduction and non-conduction, the pass band can be shifted while minimizing an increase in insertion loss within the pass band.

In another possible configuration, the first parallel-arm resonator has a resonant frequency higher than the resonant frequency of the second parallel-arm resonator.

The above-mentioned configuration makes it possible to provide a tunable filter in which, in response to switching of the first switch between conduction and non-conduction, the attenuation pole on the higher side of the pass band can be shifted in frequency while minimizing an increase in insertion loss at the higher end of the pass band.

In another possible configuration, the first parallel-arm resonator has a resonant frequency lower than the resonant frequency of the second parallel-arm resonator.

The above-mentioned configuration makes it possible to provide a tunable filter in which, in response to switching of the first switch between conduction and non-conduction, the attenuation pole on the lower side of the pass band can be shifted in frequency while minimizing an increase in insertion loss at the lower end of the pass band.

In another possible configuration, the second parallel-arm resonant circuit further includes a pair of a second impedance element and a second switch connected in parallel with each other and in series with the second parallel-arm resonator between the second parallel-arm resonator and ground.

The above-mentioned configuration makes it possible to provide a tunable filter in which, in response to switching of the first switch and the second switch between conduction and non-conduction, the attenuation pole on the higher side of the pass band and the attenuation pole on the lower side of the pass band can be shifted in frequency while minimizing an increase in insertion loss at the higher and lower ends of the pass band. Consequently, such a tunable filter allows, for example, its center frequency to be shifted while maintaining the band width of the pass band.

In another possible configuration, the second parallel-arm resonator and the second switch are connected by a fourth interconnect line, and a fourth impedance is lower than at least one of the first impedance and the second impedance, the fourth impedance being the characteristic impedance of the fourth interconnect line.

Consequently, in addition to the third impedance of the third interconnect line, the fourth impedance of the fourth interconnect line is also lowered. This helps improve attenuation, and also reduce the amplitude of the standing wave generated in the stop band located on the higher side of the pass band, thus further improving the attenuation characteristics on the higher side of the pass band.

In another possible configuration, the first parallel-arm resonant circuit further includes a second parallel-arm resonator connected in parallel with the first parallel-arm resonator. The pair of the first impedance element and the first switch connected in parallel with each other is connected in series with a circuit formed by a parallel connection of the first parallel-arm resonator and the second parallel-arm resonator. The first parallel-arm resonator has a resonant frequency different from the resonant frequency of the second parallel-arm resonator.

The above-mentioned configuration makes it possible to provide a tunable filter in which the poles (attenuation poles) on both sides of the pass band can be both shifted in frequency in response to switching of the first switch between conduction and non-conduction.

In another possible configuration, the acoustic wave filter device further includes at least one parallel-arm resonant circuit connected to a node located on the path that connects the first input/output terminal with the second input/output terminal, the node being different from the first node. Each of the at least one parallel-arm resonant circuit includes a parallel-arm resonator, and a pair of an impedance element and a switch connected in parallel with each other and in series with the parallel-arm resonator between the parallel-arm resonator and ground.

The above-mentioned configuration increases the number of stages in the ladder filter structure. This helps increase the filter characteristics of the acoustic wave filter device.

In another possible configuration, the third impedance, and the impedance of an interconnect line connecting the parallel-arm resonator with the switch in each of the at least one parallel-arm resonant circuit are lower than at least one of the first impedance and the second impedance.

The above-mentioned configuration reduces the impedances of all of the interconnect lines each connecting a parallel-arm resonator with the corresponding switch in each parallel arm. Consequently, the order of the resulting circuit increases, leading to improved attenuation. Further, the amplitude of the standing wave generated in the stop band located on the higher side of the pass band is reduced, thus further improving the attenuation characteristics on the higher side of the pass band.

According to one aspect of the present disclosure, there is provided an RF front-end circuit including the acoustic wave filter device mentioned above, and an amplifier circuit connected to the acoustic wave filter device.

The above-mentioned configuration makes it possible to provide an RF front-end circuit that allows for improved attenuation characteristics.

According to one aspect of the present disclosure, there is provided a communication apparatus including an RF integrated circuit that processes an RF signal transmitted and received by an antenna element, and the above-mentioned RF front-end circuit that transmits the RF signal between the antenna element and the RF integrated circuit.

The above-mentioned configuration makes it possible to provide a communication apparatus that allows for improved attenuation characteristics.

With the acoustic wave filter device, the RF front-end circuit, and the communication apparatus according to the present disclosure, the attenuation characteristics on the higher side of the pass band can be improved.

DETAILED DESCRIPTION

Figure 1:
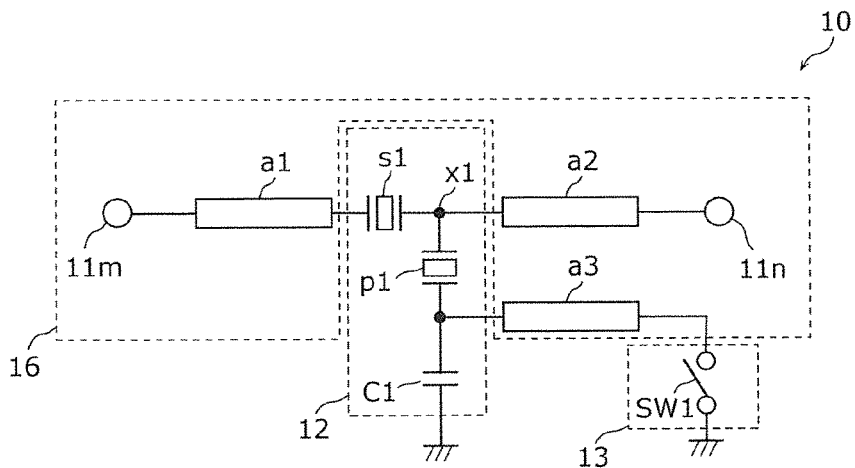
FIG. 1 illustrates the circuit configuration of an example of a filter according to Embodiment 1.

The present disclosure will be described in detail below with reference to embodiments and drawings. Embodiments described below each represent generic or specific examples. Features presented in the following embodiments, such as numerical values, shapes, materials, components, and the placement and connection of components, are illustrative only and not intended to be limiting of the present disclosure. Of the components illustrated in the following embodiments, those components not described in the independent claim representing the broadest concept of the present disclosure will be described as optional components. The sizes of components illustrated in the drawings or the ratios between the sizes of these components may not necessary be drawn to scale. Throughout the drawings, identical reference signs are used to designate substantially identical elements, and repetitive description will be sometimes omitted or simplified.

As used hereinafter, the expression "lower end of the pass band" means "lowermost frequency within the pass band". The expression "higher end of the pass band" means "uppermost frequency within the pass band". Further, as used hereinafter, the expression "lower side of the pass band" means "frequencies outside and below the pass band". The expression "higher side of the pass band" means "frequencies outside and above the pass band". Hereinafter, "lower frequency side" will be sometimes referred to as "lower side", and "higher frequency side" will be sometimes referred to as "higher side".

Embodiment 1

[1. Circuit Configuration of Filter]

FIG. 1 illustrates the circuit configuration of an example of a filter 10 according to Embodiment 1.

The filter 10 is, for example, an RF filter circuit disposed at the front-end section of a multimode/multiband-capable cellular phone. The filter 10 is, for example, a bandpass filter that is incorporated in a multiband-capable cellular phone compliant with a communication standard such as Long Term Evolution (LTE), and selectively passes RF signals within a predetermined band of frequencies and filters out unwanted RF signals that interfere with communication. The filter 10 is an acoustic wave filter device employing an acoustic wave resonator.

The filter 10 is a frequency-tunable filter (tunable filter) with a tunable pass band. As will be described hereinafter, the filter 10 includes a switching element (switch SW1), and its pass band is shifted in response to switching of the switching element between conduction (ON) and non-conduction (OFF). In the following description, the pass band of the filter 10 with the switching element placed in an ON state will be referred to as first pass band, and the pass band of the filter 10 with the switching element placed in an OFF state will be referred to as second pass band. The switching element turns on and off in accordance with a control signal from a controller such as an RF integrated circuit (RFIC).

As illustrated in FIG. 1, the filter 10 includes a series-arm resonator s1, a parallel-arm resonator p1, a capacitor C1, and a switch SW1. On a path connecting an input/output terminal 11m with an input/output terminal 11n, an interconnect line a1 (first interconnect line) is connected to the input/output terminal 11m, and an interconnect line a2 (second interconnect line) is connected to the input/output terminal 11n. The interconnect line a1 is an interconnect line that connects the input/output terminal 11m with the series-arm resonant circuit positioned closest to the input/output terminal 11m on the above-mentioned path. The interconnect line a2 is an interconnect line that connects the input/output terminal 11n with the node positioned closest to the input/output terminal 11n on the above-mentioned path. Accordingly, in Embodiment 1, the interconnect line a1 is an interconnect line that connects the input/output terminal 11m with the series-arm resonator s1, and the interconnect line a2 is an interconnect line that connects the input/output terminal 11n with a node x1. The parallel-arm resonator p1 and the switch SW1 are connected by an interconnect line a3 (third interconnect line).

The interconnect line a3 has a third impedance that is higher than at least one of a first impedance, which is the impedance of the interconnect line a1, and a second impedance, which is the impedance of the interconnect line a2. The impedance of an interconnect line refers to the characteristic impedance of the interconnect line when seen as a distributed constant line. Since each of the interconnect lines a1 and a2 is an interconnect line at the input/out terminal of the filter 10, the first and second impedances are, for example, 50Ω. In one exemplary case where the third impedance is lower than at least one of the first impedance and the second impedance, the third impedance is lower than both the first impedance and the second impedance that are set to 50Ω.

As illustrated in FIG. 1, for example, the series-arm resonator s1, the parallel-arm resonator p1, and the capacitor C1 are formed by the same chip 12, the switch SW1 is formed by a chip 13, and the interconnect lines a1, a2, and a3 are provided on or inside a wiring board 16 on which the chip 12 and the chip 13 are mounted. That is, the filter 10 is made up of, for example, the chips 12 and 13 and the wiring board 16. This configuration allows for miniaturization of the filter 10.

The switch SW1 is, for example, a single pole single throw (SPST) switching element whose one terminal is connected to a node that is connected to the parallel-arm resonator p1 and the capacitor C1, with the other terminal being connected to ground. The switch SW1 is switched between conduction (ON) and non-conduction (OFF) by a control signal from a controller (not illustrated) to thereby establish or interrupt the electrical continuity between the above-mentioned connection node and ground.

Examples of the switch SW1 include a field effect transistor (FET) switch implemented in GaAs or complementary metal oxide semiconductor (CMOS), and a diode switch.

The capacitor C1 and the switch SW1 are connected in parallel with each other to form a pair. The pair of the capacitor C1 and the switch SW1 is connected in series with the parallel-arm resonator p1 between the parallel-arm resonator p1 and ground.

The parallel-arm resonator p1, the capacitor C1, and the switch SW1 constitute a first parallel-arm resonant circuit connected between a first node (the node x1) and ground. The first node is located on the path (series arm) that connects the input/output terminal 11m with the input/output terminal 11n. That is, the first parallel-arm resonant circuit is disposed in one parallel arm that connects the series arm with ground.

For example, the input/output terminal 11m(first input/output terminal) is an input terminal to which an RF signal is input, and the input/output terminal 11n(second input/output terminal) is an output terminal from which an RF signal is output. The series-arm resonator s1 is a series-arm resonant circuit located on the path that connects the input/output terminal 11m with the input/output terminal 11n. That is, the series-arm resonator s1 is a series-arm resonant circuit provided to the series arm that connects the input/output terminal 11m with the input/output terminal 11n. The series-arm resonator s1 is formed by an acoustic wave resonator. Although the series-arm resonant circuit is formed as a single acoustic wave resonator in Embodiment 1, the series-arm resonant circuit may be an acoustic wave resonator that is divided in series or in parallel, or a longitudinally coupled resonator made up of a plurality of acoustic wave resonators. Using an acoustic wave resonator divided in series or in parallel makes it possible to enhance the electric power handling capability of the resulting filter. Using a longitudinally coupled resonator enables adaptation to filter characteristics for which, for example, attenuation enhancement is required.

The parallel-arm resonator p1 is a first parallel-arm resonator connected between the node x1 and ground (reference terminal). The node x1 is a node connected to the series-arm resonator s1 among nodes located on the path connecting the input/output terminal 11m with the input/output terminal 11n. That is, the parallel-arm resonator p1 is a resonator disposed in a parallel-arm resonant circuit that connects the node x1, which is located on the above-mentioned series arm, with ground. In Embodiment 1, the node x1 is a node connected to a portion of the series-arm resonator s1 that is located adjacent to the input/output terminal 11n.

In the following description, for the sake of convenience, the singular point at which the impedance of a resonator has a local minimum (ideally the point of zero impedance) will be referred to as "resonant point", and the frequency at the resonant point will be referred to as "resonant frequency". Further, the singular point at which the impedance has a local maximum (ideally the point of infinite impedance) will be referred to as "anti-resonant point", and the frequency at the anti-resonant point will be referred to as "anti-resonant frequency".

Each of the series-arm resonator s1 and the parallel-arm resonator p1 is formed as an acoustic wave resonator having a resonant frequency and an anti-resonant frequency, examples of which include a surface acoustic wave (SAW) resonator, a bulk acoustic wave (BAW) resonator, and a film bulk acoustic resonator (FBAR). Examples of SAWs include not only surface acoustic waves but also boundary waves. The parallel-arm resonator may be any resonator or circuit that is represented by an equivalent circuit model (e.g., BVD model) made up of inductance and capacitance components and has resonant and anti-resonant frequencies.

When the switch SW1 of the filter 10 is ON, the capacitor C1 connected in parallel with the switch SW1 is shorted (not selected). The impedance characteristics of the first parallel-arm resonant circuit at this time are represented by the impedance characteristics of the parallel-arm resonator p1, and the first parallel-arm resonant circuit forms a first pass band together with the series-arm resonator s1.

The parallel-arm resonator p1 is designed to have an anti-resonant frequency that lies within the first pass band of the filter 10, and a resonant frequency located on the lower side of the first pass band. The series-arm resonator s1 is designed to have a resonant frequency that lies within the first pass band of the filter 10, and an anti-resonant frequency located on the higher side of the first pass band. Accordingly, the anti-resonant frequency of the parallel-arm resonator p1 and the resonant frequency of the series-arm resonator s1 form the first pass band, the resonant frequency of the parallel-arm resonator p1 forms the attenuation pole on the lower side of the first pass band, and the anti-resonant frequency of the series-arm resonator s1 forms the attenuation pole on the higher side of the first pass band.

In Embodiment 1, the capacitor C1 is an impedance element connected in series with the parallel-arm resonator p1. The frequency-tuning range of the attenuation pole on the lower side of the pass band of the filter 10 is dependent on the constant of the capacitor C1. For example, the frequency-tuning range increases as the constant of the capacitor C1 decreases. Accordingly, the constant of the capacitor C1 may be determined as appropriate in accordance with frequency specifications required for the filter 10. Alternatively, the capacitor C1 may be a variable capacitor such as a varicap diode or a digital tunable capacitor (DTC). This allows for fine adjustment of frequency-tuning range. An impedance element may be connected between the node x1 and the parallel-arm resonator p1.

For the convenience of explanation, in the following description, not only for a single resonator used alone but also for a parallel-arm resonant circuit made up of a resonator and an impedance element, the singular point at which the combined impedance of the resonator and the impedance element has a local minimum (ideally the point of zero impedance) will be referred to as "resonant point", and the frequency at the resonant point will be referred to as "resonant frequency". Further, the singular point at which the combined impedance has a local maximum (ideally the point of infinite impedance) will be referred to as "anti-resonant point", and the frequency at the anti-resonant point will be referred to as "anti-resonant frequency".

When the switch SW1 of the filter 10 is OFF, the capacitor C1 connected in parallel with the switch SW1 is selected. The impedance characteristics of the first parallel-arm resonant circuit at this time are represented by the combined characteristics of the series connection of the parallel-arm resonator p1 and the capacitor C1, and the first parallel-arm resonant circuit forms a second pass band together with the series-arm resonator s1.

The combined characteristics of the series connection of the parallel-arm resonator p1 and the capacitor C1 are designed such that the anti-resonant frequency is located within the second pass band of the filter 10, and the resonant frequency is located on the lower side of the second pass band. Consequently, the anti-resonant frequency obtained by the combined characteristics of the series connection of the first parallel-arm resonator and the capacitor C1, and the resonant frequency of the series-arm resonator s1 form the second pass band, and the resonant frequency obtained by the combined characteristics of the series connection of the first parallel-arm resonator and the capacitor C1 forms the attenuation pole on the lower side of the second pass band.

Therefore, for the first parallel-arm resonant circuit, the frequency at which the impedance has a local minimum shifts lower or higher as the switch SW1 is switched between ON (conducting) and OFF (non-conducting) states. That is, the first parallel-arm resonant circuit allows tuning of the frequency of the attenuation pole located on the lower side of the pass band of the filter 10. As described above, the filter 10 is a tunable filter with tunable frequency in which the attenuation pole on the lower side of the pass band is shifted higher by switching the switch SW1 from an ON state to an OFF state. In the following, the filter characteristics exhibited by the filter 10 as the switch SW1 is switched ON/OFF will be described with reference to a filter according to a typical example. Although the filter according to the typical example described below and the filter 10 differ in operation frequency band, the attenuation pole on the lower side of the pass band exhibits substantially the same tendency of shifting also for the operation frequency band of the filter according to the typical example.

Figure 2A:
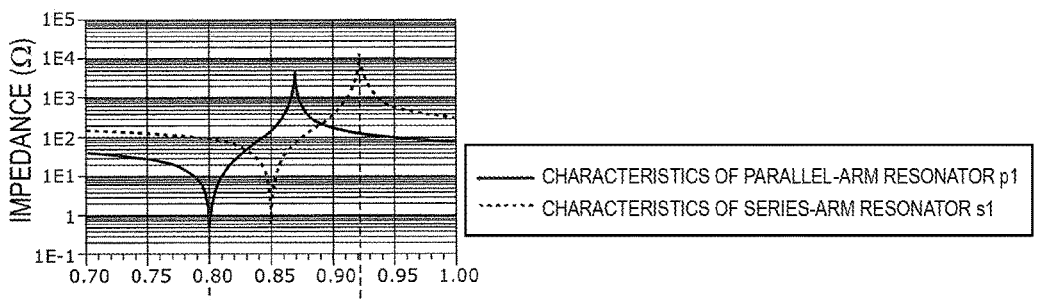
FIGS. 2A-2C illustrate graphs representing the characteristics of a filter according to a typical example of Embodiment 1.
Figure 2B:
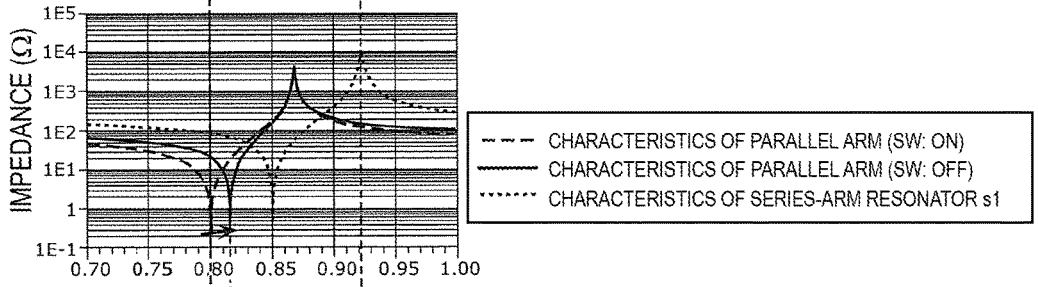
Figure 2C:
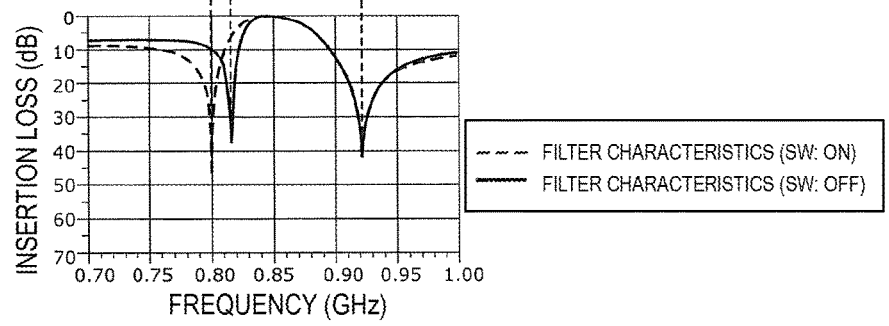

FIGS. 2A-2C illustrate graphs representing the characteristics of a filter according to a typical example of Embodiment 1. Specifically, the graph in FIG. 2A represents the impedance characteristics of each resonator alone (each of the parallel-arm resonator p1 and the series-arm resonator s1). The graph in FIG. 2B compares the impedance characteristics of the first parallel-arm resonant circuit between the ON and OFF states of the switch SW1. The impedance characteristics of the series-arm resonator s1 are also illustrated in FIG. 2B. The graph in FIG. 2C compares the filter characteristics between the ON and OFF states of the switch SW1.

In the ON state of the switch SW1, the filter according to the typical example has first bandpass characteristics in which the pass band is determined by the anti-resonant frequency of the parallel-arm resonator p1 and the resonant frequency of the series-arm resonator s1, the pole (attenuation pole) on the lower side of the pass band is determined by the resonant frequency of the parallel-arm resonator p1, and the pole (attenuation pole) on the higher side of the pass band is determined by the anti-resonant frequency of the series-arm resonator s1.

By contrast, in the OFF state of the switch SW1, the impedance characteristics of the parallel-arm resonator p1 are subject to the influence of the capacitor C1. That is, in this state, the combined characteristics of the parallel-arm resonator p1 and the capacitor C1 represent the impedance characteristics of the first parallel-arm resonant circuit.

Consequently, as indicated by the solid arrow in FIG. 2B, for the impedance characteristics of the first parallel-arm resonant circuit, the resonant frequency shifts higher as the switch SW1 switches from ON to OFF, causing the filter according to the typical example to have second bandpass characteristics different from the first bandpass characteristics.

The above-mentioned configuration makes it possible to provide a tunable filter with a tunable pass band, in which the attenuation pole on the lower side of the pass band shifts higher as the switch SW1 is switched from ON to OFF.

The impedance element may not necessary be a capacitor but may be, for example, an inductor. If an inductor is used as an impedance element, upon switching the switching element ON/OFF, the pass band shifts in a direction different from the direction in which the pass band shifts if a capacitor is used as an impedance element. Specifically, as the switching element is switched from ON to OFF, the attenuation pole on the lower side of the pass band shifts higher if a capacitor is used and shifts lower if an inductor is used. The frequency-tuning range of the pass band is dependent on the constant of the inductor. For example, the frequency-tuning range increases as the constant of the inductor increases. Accordingly, the constant of the inductor may be determined as appropriate in accordance with frequency specifications required for the filter 10. In this case, the inductor may be a variable inductor employing micro electro mechanical systems (MEMS). This allows for fine adjustment of frequency-tuning range.

Figure 3:
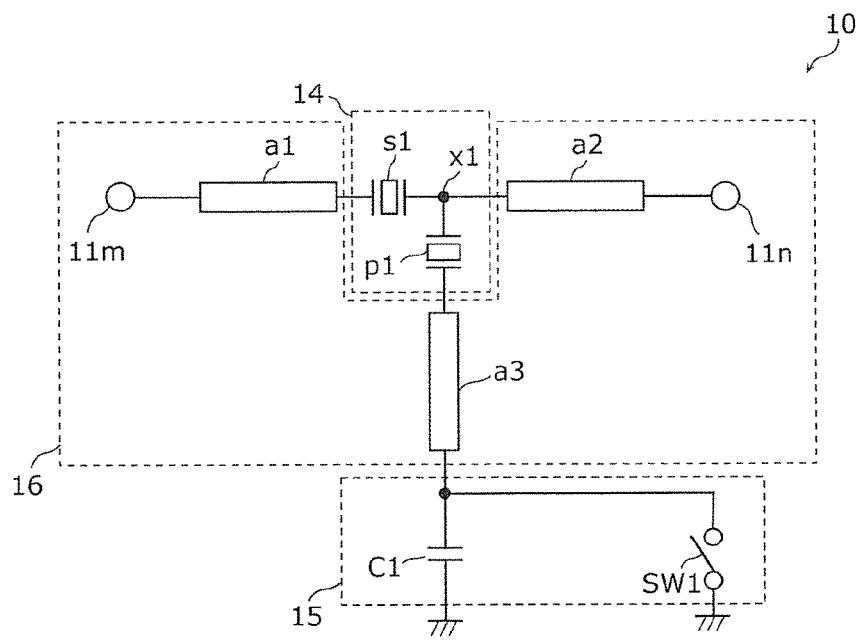
FIG. 3 illustrates the circuit configuration of another example of the filter according to Embodiment 1.

As illustrated in FIG. 3, the series-arm resonator s1 and the parallel-arm resonator p1 may be formed by the same chip 14, and the switch SW1 and the capacitor C1 may be formed by the same chip 15. In this case, the interconnect line a3 is positioned between the parallel-arm resonator p1, and the parallel circuit of the capacitor C1 and the switch SW1. The configuration illustrated in FIG. 3 provides an effect identical to the effect (which will be described later) provided by the configuration illustrated in FIG. 1, and thus will not be described in further detail.

Figure 4:
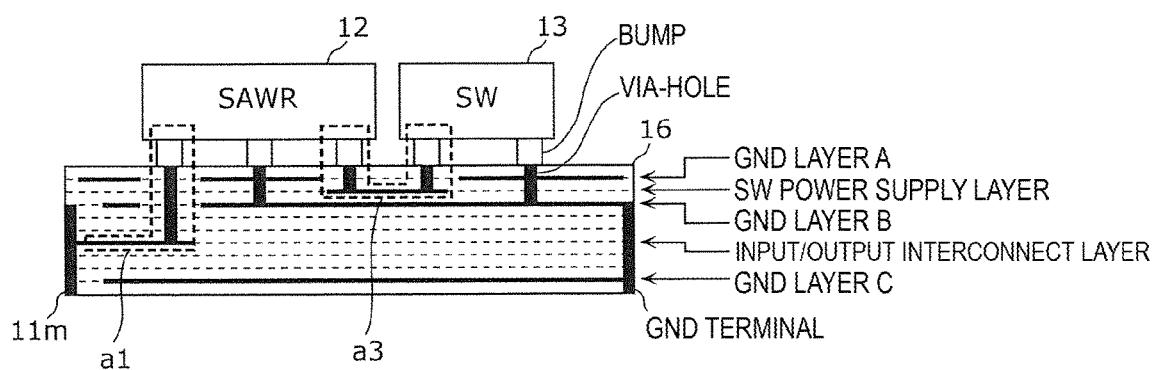
FIG. 4 illustrates an example of various layers of a wiring board on which chips constituting the filter according to Embodiment 1 are mounted.

FIG. 4 illustrates an example of various layers of the wiring board 16 on which the chips 12 and 13 constituting the filter 10 according to Embodiment 1 are mounted. The wiring board 16 is a multilayer substrate. In FIG. 4, various layers of the wiring board 16 are schematically indicated by dashed lines. Of these layers, layers provided with ground (ground pattern) are depicted as GND layers A, B, and C, a layer provided with a control interconnect line for controlling the switch SW and a power supply interconnect line for the switch SW is depicted as a SW power supply layer, and a layer provided with the interconnect line a1 connected to the input/output terminal 11m is depicted as an input/output interconnect layer. The thick solid lines over the dashed lines representing the GND layers A, B, and C, each represents ground. In Embodiment 1, the SW power supply layer is provided with both the control interconnect line and the power supply interconnect line. In FIG. 4, the interconnect line a2 and the input/output terminal 11n, the control interconnect line for controlling the switch SW1, and the power supply interconnect line for the switch SW1 are not illustrated.

The term interconnect line as used herein includes, for example, the interconnect lines, bumps, and via-holes of the chips 12 and 13, as well as the interconnect lines and via-holes of the wiring board 16. Therefore, the interconnect line a1 includes the following elements located on the path from the input/output terminal 11m to the series-arm resonator s1: interconnect lines inside the wiring board 16; the via-holes of the wiring board 16; the bumps of the chip 12; and interconnect lines inside the chip 12 (not illustrated in FIG. 4). Although not illustrated in FIG. 4, the interconnect line a2 includes the following elements located on the path from the input/output terminal 11n to the node x1: interconnect lines inside the wiring board 16; the via-holes of the wiring board 16; the bumps of the chip 12; and interconnect lines inside the chip 12. The interconnect line a3 includes the following elements located on the path from the parallel-arm resonator p1 to the switch SW1: interconnect lines inside the chip 12 (not illustrated in FIG. 4); the bumps of the chip 12; the via-holes of the wiring board 16 connected to the bumps of the chip 12; interconnect lines inside the wiring board 16; the via-holes of the wiring board 16 connected to the bumps of the chip 13; the bumps of the chip 13; and interconnect lines inside the chip 13 (not illustrated in FIG. 4).

As described above, the third impedance of the interconnect line a3 is lower than both the first impedance of the interconnect line a1 and the second impedance of the interconnect line a2. The following description will focus on the interconnect lines a1 and a3 to describe the first impedance and the third impedance.

The interconnect line a1 is provided in or on the input/output interconnect layer. When it is stated that the interconnect line a1 is provided in or on the input/output interconnect layer, this means that a portion of the path extending from the input/output terminal 11$m$ to the series-arm resonator s1 and constituting the interconnect line a1 is provided in or on the input/output interconnect layer as an interconnect pattern. FIG. 4 depicts that a portion of the interconnect line a1 is provided in or on the input/output interconnect layer.

The interconnect line a3 is provided in or on the SW power supply layer. When it is stated that the interconnect line a3 is provided in or on the SW power supply layer, this means that a portion of the path extending from the parallel-arm resonator p1 to the switch SW1 and constituting the interconnect line a3 is provided in or on the SW power supply layer as an interconnect pattern. FIG. 4 depicts that a portion of the interconnect line a3 is provided in or on the SW power supply layer.

The impedance of an interconnect line decreases with decreasing distance between the interconnect line and ground. This is because when the filter 10 is seen as a lumped constant circuit, the smaller the distance between the interconnect line and ground, the greater the capacitance between the interconnect line and ground and the smaller the inductance component of the interconnect line. Since the third impedance of the interconnect line a3 is lower than the first impedance of the interconnect line a1, the distance between the interconnect line a3 and ground needs to be made shorter than the distance between the interconnect line a1 and ground. As illustrated in FIG. 4, the distance between the interconnect pattern provided in or on the SW power supply layer and constituting a portion of the interconnect line a3 and the ground provided in or on the GND layer A or B is smaller than the distance between the interconnect pattern provided in or on the input/output interconnect layer and constituting a portion of the interconnect line a1 and the ground provided in or on the GND layer B or C. Specifically, the interconnect pattern of the interconnect line a1 provided in or on the input/output interconnect layer is separated from the ground provided in or on the GND layer B or C by a distance of, for example, 150 µm, and the interconnect pattern of the interconnect line a3 provided in or on the SW power supply layer is separated from the ground provided in or on the GND layer A or B by a distance of, for example, 20 µm. This configuration makes the third impedance of the interconnect line a3 lower than the first impedance of the interconnect line a1.

The SW power supply layer is provided with the control interconnect line for controlling conduction and non-conduction of the switch SW1 and with the power supply interconnect line for supplying a power supply voltage to the switch SW1. For this reason, noise generated in each of the control circuit and the power supply circuit tends to leak from the SW power supply layer. Accordingly, to shield against noise leaking from the SW power supply layer, the SW power supply layer is covered with GND layers, each provided with an electrode connected to ground. As illustrated in FIG. 4, the SW power supply layer is sandwiched by the GND layers A and B. The control interconnect line and the power supply interconnect line are circuits for performing ON/OFF switching of the switch, and isolated from the RF signal path of the filter 10. Therefore, the control interconnect line and the power supply interconnect line do not affect filter characteristics regardless of their characteristic impedances. Accordingly, to achieve lower profile, it is desirable to reduce the distance between each ground layer mentioned above and the SW power supply layer. That is, the characteristic impedance of each of the control interconnect line and the power supply interconnect line is set to a low value. Therefore, providing the interconnect line a3 in or on the SW power supply layer makes it possible to achieve both reduced distance between the interconnect line a3 and ground, and lower profile of the wiring board 16.

If the interconnect line a3 is provided in or on the SW power supply layer, noise generated from each of the power supply circuit and the control circuit affects the interconnect line a3. In this regard, the parallel-arm resonator p1 connected to the interconnect line a3 is designed to exhibit high impedance in the pass band of the filter 10. Thus, the noise is blocked by the parallel-arm resonator p1.

The above-mentioned configuration ensures that even if the interconnect line a3 is provided in or on the SW power supply layer, an RF signal passing through the filter 10 is not affected by the noise from each of the control interconnect line and the power supply interconnect line, thus allowing for miniaturization and lower profile.

Although the series-arm resonator s1, the parallel-arm resonator p1, the capacitor C1, and the switch SW1 are provided on the wiring board 16 as chips, in an alternative configuration, for example, the series-arm resonator s1, the parallel-arm resonator p1, the capacitor C1, and the switch SW1 may be provided directly, such as by being embedded in the wiring board 16.

[2. Resonator Structure]

The structure of each resonator constituting the filter 10 will be described in more detail below, with particular reference to a given resonator of interest. Resonators other than the resonator of interest are generally identical in structure to the resonator of interest, and thus their structure will not be described in detail.

Figures 5A, 5B:
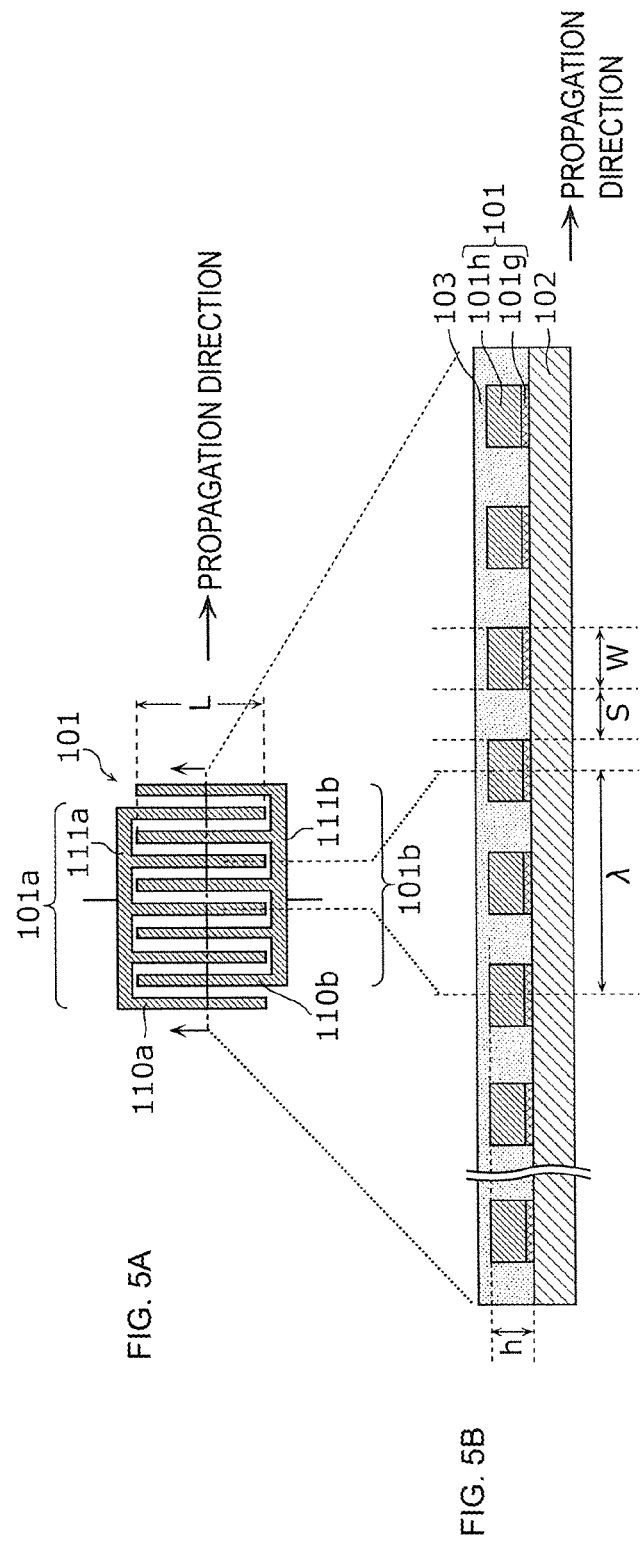
FIGS. 5A and 5B schematically illustrate the structure of a resonator according to Embodiment 1.

FIGS. 5A and 5B are exemplary schematic illustrations of a structure according to Embodiment 1 with a surface acoustic wave resonator used as a resonator. FIG. 5A is a plan view, and FIG. 5B is a cross-sectional view of FIG. 5A. The resonator in FIGS. 5A and 5B is illustrated for the purpose of explaining a typical structure of each resonator constituting the filter 10. Accordingly, features such as the number and length of electrode fingers constituting the IDT electrode of each resonator of the filter 10 are not limited to those depicted in FIGS. 5A and 5B. Reflectors constituting the resonator are not illustrated in FIGS. 5A and 5B.

As illustrated in FIGS. 5A and 5B, the resonator includes an IDT electrode 101, a substrate 102 having piezoelectric property and on which the IDT electrode 101 is provided, and a protective layer 103 that covers the IDT electrode 101. These components will be described below in detail.

As illustrated in FIG. 5A, a pair of mutually-parallel comb electrodes 101$a$ and 101$b$ constituting the IDT electrode 101 is disposed on the substrate 102 having piezoelectric property. The comb electrode 101$a$ includes a plurality of mutually-parallel electrode fingers 110$a$, and a busbar electrode 111$a$ that connects the plurality of electrode fingers 110$a$. The comb electrode 101$b$ includes a plurality of mutually-parallel electrode fingers 110$b$, and a busbar electrode 111$b$ that connects the plurality of electrode fingers 110b. The plurality of electrode fingers 110a and the plurality of electrode fingers 110b are disposed in a direction orthogonal to the direction of wave propagation.

Each of the comb electrodes 101a and 101b alone is referred to as IDT electrode in some cases. However, for convenience, the following description assumes that a single IDT electrode 101 is made up of the pair of comb electrodes 101a and 101b.

The IDT electrode 101, which includes the plurality of electrode fingers 110a and the plurality of electrode fingers 110b as well as the busbar electrodes 111a and 111b, has a multilayer structure as illustrated in FIG. 5B. The multilayer structure includes an adhesion layer 101g and a main electrode layer 101h.

The adhesion layer 101g serves to improve the adhesion between the substrate 102 having piezoelectric property and the main electrode layer 101h. The adhesion layer 101g is made of, for example, Ti. The adhesion layer 101g has a film thickness of, for example, 12 nm.

The main electrode layer 101h is made of, for example, Al containing 1% of Cu. The main electrode layer 101h has a film thickness of, for example, 162 nm.

The substrate 102 having piezoelectric property is a substrate on which the IDT electrode 101 is disposed. For example, the substrate 102 is made solely of one of a $LiTaO_3$ piezoelectric single crystal, a $LiNbO_3$ piezoelectric single crystal, a $KNbO_3$ piezoelectric single crystal, quartz, and a piezoelectric ceramic material, or formed as a multilayer body thereof. As for the substrate 102 having piezoelectric property, at least a portion of the substrate may have piezoelectric property. At least the surface of such a piezoelectric substrate has piezoelectric property. In one exemplary configuration, the surface of the substrate may be provided with a piezoelectric thin film, and the substrate may be formed by a multilayer body made up of a film having a different acoustic velocity from the piezoelectric thin film, a support substrate, and other components. In another exemplary configuration, the substrate may be formed as one of the following multilayer bodies: a multilayer body including a high acoustic velocity support substrate, and a piezoelectric thin film provided over the high acoustic velocity support substrate; a multilayer body including a high acoustic velocity support substrate, a low acoustic velocity film provided over the high acoustic velocity support substrate, and a piezoelectric thin film provided over the low acoustic velocity film; and a multilayer body including a support substrate, a high acoustic velocity film provided over the support substrate, a low acoustic velocity film provided over the high acoustic velocity film, and a piezoelectric thin film provided over the low acoustic velocity film. The entirety of the substrate may have piezoelectric property.

The protective layer 103 is formed so as to cover the comb electrodes 101a and 101b. The protective layer 103 is provided for purposes such as protecting the main electrode layer 101h from the external environment, adjusting frequency-temperature characteristics, and enhancing moisture resistance. The protective layer 103 is made of, for example, silicon dioxide as a main component.

The structure of each resonator constituting the filter 10 is not limited to the structure illustrated in FIGS. 5A and 5B. For example, instead of being formed as a multilayer metal-film structure, the IDT electrode 101 may be formed as a single metal-film layer. The respective materials of the adhesion layer 101g, the main electrode layer 101h, and the protective layer 103 are not limited to the materials mentioned above. The IDT electrode 101 may be made of a metal such as Ti, Al, Cu, Pt, Au, Ag, or Pd, or an alloy thereof. Alternatively, the IDT electrode 101 may be formed by a plurality of multilayer bodies made of the above-mentioned metal or alloy. The protective layer 103 may not be provided.

The wave length of an acoustic wave excited by the resonator (acoustic wave resonator) configured as described above is determined by factors such as design parameters of the IDT electrode 101. That is, the resonant frequency and anti-resonant frequency of the resonator are determined by factors such as design parameters of the IDT electrode 101. The following describes design parameters of the IDT electrode 101, that is, design parameters of the comb electrodes 101a and 101b.

The wave length of the above-mentioned acoustic wave is determined by the repetition period $\lambda$ of the plurality of electrode fingers 110a or 110b constituting the comb electrodes 101a and 101b illustrated in FIGS. 5A and 5B. Electrode pitch (electrode period) equals ½ of the repetition period $\lambda$. Letting W represent the line width of each of the electrode fingers 110a and 110b constituting the comb electrodes 101a and 101b, and S represent the spacing between two adjacent electrode fingers 110a and 110b, the electrode pitch is defined as (W+S). The crossing width L of the IDT electrode 101 refers to the length of overlapping electrode fingers when the electrode fingers 110a of the comb electrode 101a and the electrode fingers 110b of the filter device comb electrode 101b are viewed in the direction of acoustic wave propagation as illustrated in FIG. 5A. Electrode duty (duty factor) refers to the ratio occupied by the line widths of the plurality of electrode fingers 110a and 110b. Specifically, electrode duty refers to the ratio of the line widths of the plurality of electrode fingers 110a and 110b to the sum of the above-mentioned line widths and the spacings between the plurality of electrode fingers 110a and 110b and is defined as W/(W+S). The number of pairs refers to the number of electrode finger pairs formed by the electrode fingers 110a and 110b of the comb electrodes 101a and 101b and equals roughly half the total number of electrode fingers 110a and 110b. In this case, for example, M=2N+1 is satisfied, where N is the number of pairs, and M is the total number of electrode fingers 110a and 110b. That is, the number of regions sandwiched by the distal end portion of a single electrode finger of one of the comb electrodes 101a and 101b, and the busbar electrode of the other comb electrode that faces the above-mentioned distal end portion corresponds to 0.5 pairs. The film thickness of the IDT electrode 101 refers to the thickness h of each of the plurality of electrode fingers 110a and 110b.

As with the resonators, for example, the capacitors constituting the filter 10 are formed by comb electrodes with a plurality of electrode fingers arranged in the direction of acoustic wave propagation. Each capacitor may be formed by, for example, a three-dimensional interconnect structure having two stacked interconnect lines serving as counter electrodes, with an insulator layer or dielectric layer provided between the counter electrodes.

[3. Filter Characteristics]

Next, the filter characteristics of a filter 10A according to an application example of Embodiment 1 will be described. The filter 10 described above includes a single series-arm resonant circuit (series-arm resonator s1), and a first parallel-arm resonant circuit connected between the node x1, which is located in the series-arm resonant circuit, and ground. Alternatively, the filter (acoustic wave filter device) may further include at least one parallel-arm resonant circuit connected to a node that is located on the path connecting the input/output terminal 11m with the input/output terminal 11n and is different from the node x1, and at least one series-arm resonant circuit located on the path. The filter 10A according to the application example of Embodiment 1 includes, for example, a third parallel-arm resonant circuit and a fourth parallel-arm resonant circuit, which represent an example of at least one parallel-arm resonant circuit, and series-arm resonators s2 and s3, which represent an example of at least one series-arm resonant circuit.

Figure 6:
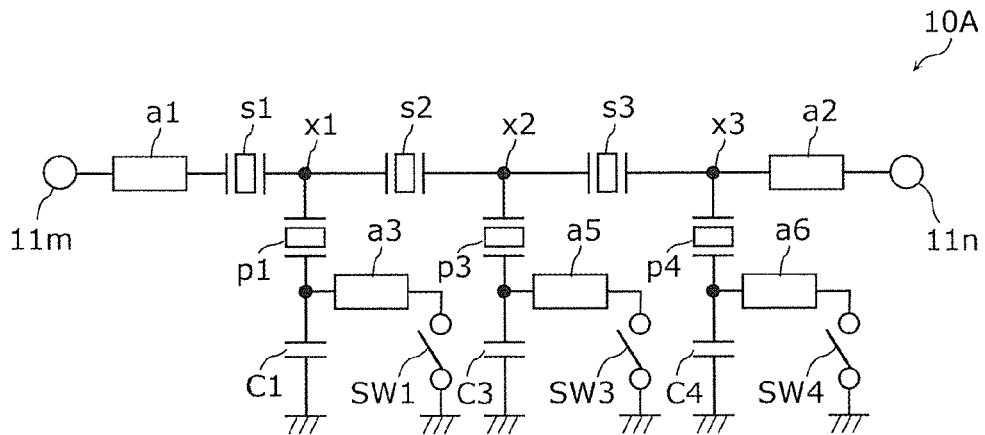
FIG. 6 illustrates the circuit configuration of a filter according to an application example of Embodiment 1.

FIG. 6 illustrates the circuit configuration of the filter 10A according to the application example of Embodiment 1.

The third parallel-arm resonant circuit includes a parallel-arm resonator p3 connected to a node (a node x2 in FIG. 6) different from the node x1, and a pair of a capacitor C3 (impedance element) and a switch SW3 connected in parallel with each other and in series with the parallel-arm resonator p3 between the parallel-arm resonator p3 and ground. The fourth parallel-arm resonant circuit includes a parallel-arm resonator p4 connected to a node (a node x3 in FIG. 6) different from the node x1, and a pair of a capacitor C4 (impedance element) and a switch SW4 connected in parallel with each other and in series with the parallel-arm resonator p4 between the parallel-arm resonator p4 and ground. An impedance element may be connected between the node x2 and the parallel-arm resonator p3, and between the node x3 and the parallel-arm resonator p4.

The series-arm resonators s2 and s3 are series-arm resonant circuits connected in series with the series-arm resonator s1 between the input/output terminal 11m and the input/output terminal 11n. The series-arm resonators s2 and s3 are resonators disposed in mutually different series arms connecting the input/output terminal 11m with the input/output terminal 11n. The mutually different series arms may not necessarily be provided with the series-arm resonators s2 and s3 but may be provided with a series-arm resonant circuit formed by one or more acoustic wave resonators.

The interconnect line a1 is an interconnect line connecting the input/output terminal 11m with the series arm resonant circuit that is positioned closest to the input/output terminal 11m on the path connecting the input/output terminal 11m with the input/output terminal 11n. The interconnect line a2 is an interconnect line connecting the input/output terminal 11n with the node that is positioned closest to the input/output terminal 11n on the above-mentioned path. Accordingly, in Embodiment 1, the interconnect line a1 is an interconnect line that connects the input/output terminal 11m with the series-arm resonator s1, and the interconnect line a2 is an interconnect line that connects the input/output terminal 11n with the node x3. The parallel-arm resonator p3 and the switch SW3 are connected by an interconnect line a5, and the parallel-arm resonator p4 and the switch SW4 are connected by an interconnect line a6. The impedance of the interconnect line a5 is defined as fifth impedance, and the impedance of the interconnect line a6 is defined as sixth impedance.

Figure 7A:
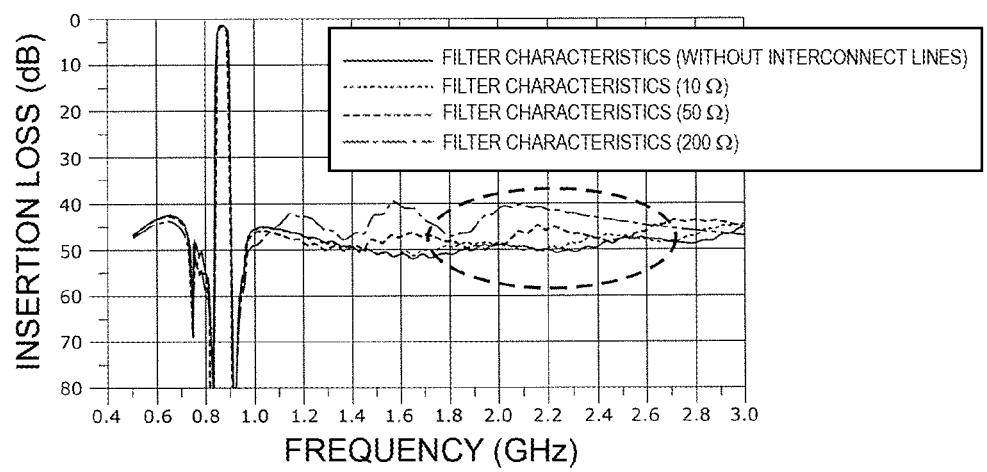
FIG. 7A illustrates a graph representing the filter characteristics exhibited by the filter according to the application example of Embodiment 1 in a switch-on state as third, fifth, and sixth impedances are varied.

FIG. 7A illustrates a graph representing the filter characteristics exhibited by the filter 10A according to the application example of Embodiment 1 in a switch-on state as the third impedance, the fifth impedance, and the sixth impedance are varied. The solid line in FIG. 7A represents the characteristics of the filter 10A for a case in which the interconnect lines a3, a5, and a6 are not provided, that is, for a case in which the parallel-arm resonators p1, p3, and p4 are directly connected with the switches SW1, SW3, and SW4, respectively. The dotted line, the dashed line, and the alternate long and short dash line respectively represent the filter characteristics for cases in which all of the third impedance, the fifth impedance, and the sixth impedance are 10Ω, 50Ω, and 200Ω.

The first impedance of the interconnect line a1 and the second impedance of the interconnect line a2 in the pass band are each set to, for example, 50Ω in conformity with the normalized impedance of the filter 10A.

In recent years, the need to support carrier aggregation (CA) has led to widespread use of branching filters that separate (divide) RF signals into different frequency bands. Multiplexers including a plurality of filters have been proposed as such a branching filter. In such a multiplexer, respective one terminals of the filters are connected directly, or connected together via a phaser or a filter selector switch to form a common terminal. As a consequence, the characteristics of one filter can affect the characteristics of another filter. This means that the characteristics of one filter that present no problem for the one filter itself can cause degradation of the characteristics of another filter. Specifically, the attenuation characteristics in the stop band (rejection band) located above the pass band of one filter do not affect the attenuation characteristics within the pass band of the one filter itself. However, if the frequencies in the above-mentioned stop band lie within the pass band of another filter, this can cause degradation of the bandpass characteristics in the pass band of the other filter.

When the switches SW1, SW3, and SW4 are placed in an ON state, as illustrated in FIG. 7A, the filter 10A exhibits bandpass characteristics with a pass band occupying a specific band of frequencies and exhibits attenuation characteristics with a stop band located on the higher side of the pass band, for example, in the Middle and High Bands (1710 to 2690 MHz: the location indicated by a dashed circle in FIG. 7A). For example, if one of the filters of the multiplexer mentioned above is the filter 10A, and another filter has a pass band in the Middle and High Bands, if the filter 10A has a small attenuation in the stop band, this can cause degradation of the bandpass characteristics in the pass band of the other filter.

Figure 7B:
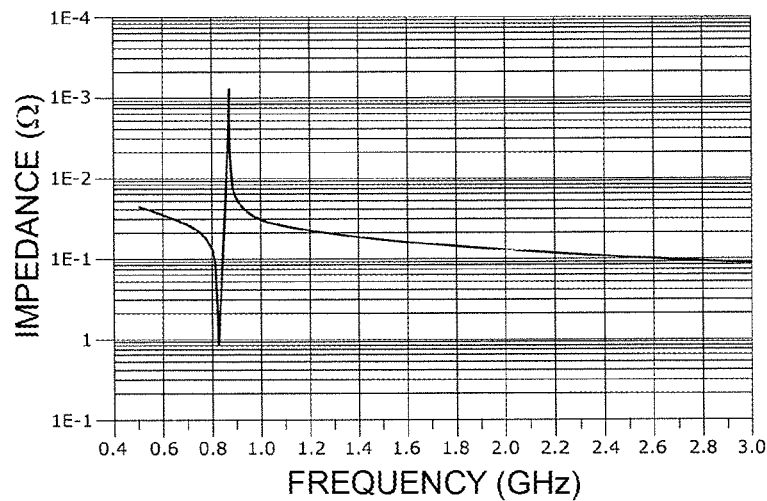
FIG. 7B illustrates a graph representing the impedance characteristics of a parallel-arm resonator according to the application example of Embodiment 1.

With the switches SW1, SW3, and SW4 of the filter 10A placed in an ON state, the parallel-arm resonators p1, p3, and p4 are respectively connected to ground via the interconnect lines a3, a5, and a6. FIG. 7B illustrates a graph representing the impedance characteristics of the parallel-arm resonator p1. In the stop band on the higher side of the pass band, the parallel-arm resonator p1 functions as a capacitor. Accordingly, as illustrated in FIG. 7B, the parallel-arm resonator p1 exhibits low impedance in the stop band located on the higher side of the pass band. For example, this impedance is lower than or equal to 20Ω at frequencies of 1710 MHz or above that correspond to the Middle Band. Although not illustrated, the same is true also for the parallel-arm resonators p3 and p4. That is, as with the parallel-arm resonator p1, the parallel-arm resonators p3 and p4 also exhibit low impedance in the stop band located on the higher side of their pass band. Therefore, as illustrated in FIG. 7A, the higher the third, fifth, and sixth impedances, the greater the impedance mismatch between the interconnect lines a3, a5, and a6 and the corresponding parallel-arm resonators p1, p3, and p4 and the larger the ripples in the attenuation characteristics, leading to degradation of attenuation. This is because the higher the third, fifth, and sixth impedances, the greater the amplitude on the higher side of the pass band due to the standing wave caused by the impedance mismatch due to the respective third, fifth, and sixth impedances of the interconnect lines a3, a5, and a6. Therefore, by lowering the third impedance, the attenuation characteristics of the filter 10A can be improved, and degradation of the bandpass characteristics of the other filter mentioned above can be reduced.

Figure 7C:
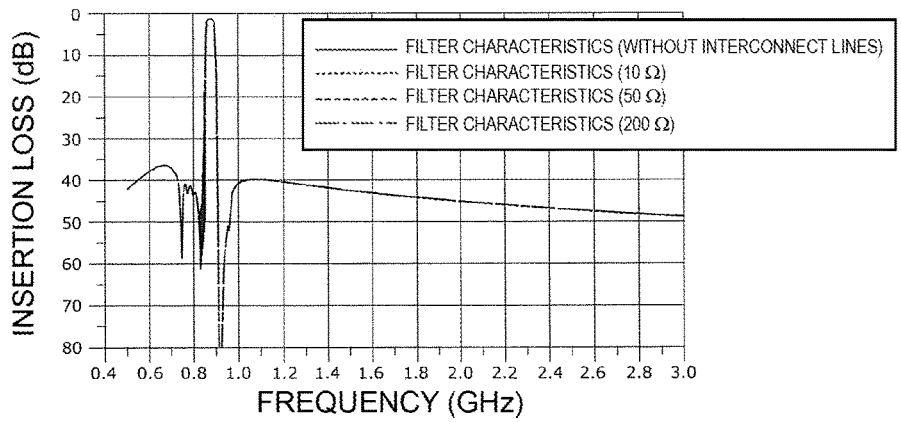
FIG. 7C illustrates a graph representing the filter characteristics exhibited by the filter according to the application example of Embodiment 1 in a switch-on state as the third, fifth, and sixth impedances are varied.

FIG. 7C illustrates a graph representing the filter characteristics exhibited by the filter 10A according to the application example of Embodiment 1 in a switch-on state as the third impedance, the fifth impedance, and the sixth impedance are varied. The solid line, the dotted line, the dashed line, and the alternate long and short dash line in FIG. 7C represent the same characteristics as those in FIG. 7A. Since the interconnect lines a3, a5, and a6 respectively become open due to the switches SW1, SW3, and SW4, changing the third impedance, the fifth impedance, and the sixth impedance does not affect the bandpass characteristics as illustrated in FIG. 7C.

Next, the following describes the bandpass characteristics in the pass band of the filter 10A as the third impedance, the fifth impedance, and the sixth impedance are lowered.

Figure 8:
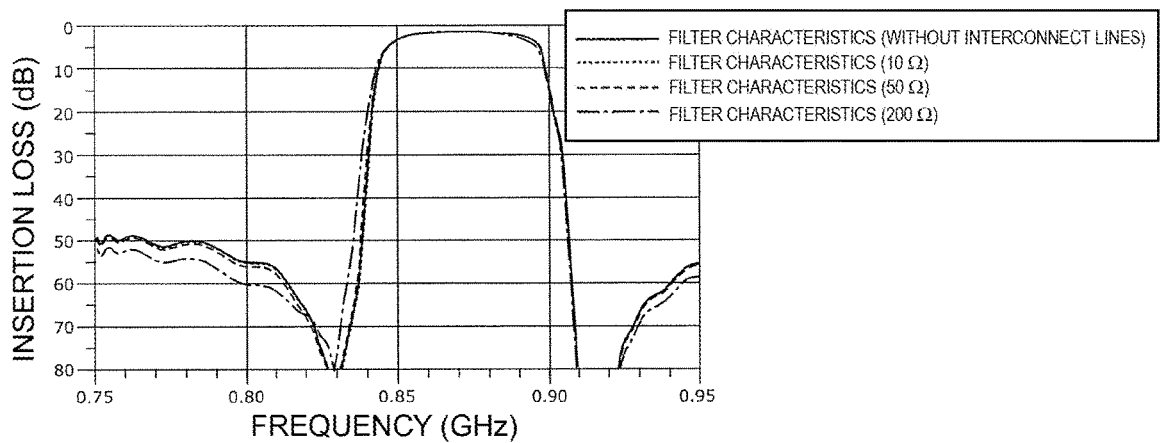
FIG. 8 illustrates a graph representing the pass band of the filter according to the application example of Embodiment 1 in a switch-on state as third, fifth, and sixth impedances are varied.

FIG. 8 illustrates a graph representing the pass band of the filter 10A according to an application example of Embodiment 1 in a switch-on state with varying values of the third impedance, the fifth impedance, and the sixth impedance.

As illustrated in FIG. 8, changing the third impedance, the fifth impedance, and the sixth impedance does not result in large changes in bandpass characteristics in the pass band of the filter 10A.

Further, the smaller the third, fifth, and sixth impedances are than the first and second impedances (than 50Ω), the greater the resulting improvement in attenuation characteristics. In this regard, the following describes, with reference to Table 1 and FIG. 9, the specific value of Ω at or below which the third impedance, the fifth impedance, and the sixth impedance are to be set. In Table 1 and FIG. 9, the third impedance, the fifth impedance, and the sixth impedance are collectively indicated as "impedance".

TABLE 1

| Impedance [Ω] | Attenuation [dB] |
|---|---|
| 0 | 48.6 |
| 1.0 | 47.0 |
| 2.5 | 47.2 |
| 5.0 | 47.1 |
| 10.0 | 46.9 |
| 15.0 | 46.1 |
| 20.0 | 46.3 |
| 25.0 | 46.1 |
| 30.0 | 45.7 |
| 40.0 | 45.1 |
| 50.0 | 44.2 |
| 75.0 | 43.1 |
| 100.0 | 42.3 |
| 150.0 | 41.1 |
| 200.0 | 40.3 |

Figure 9:
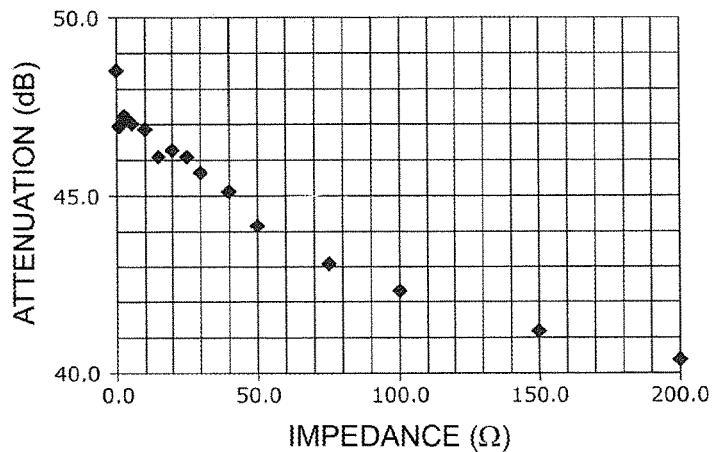
FIG. 9 illustrates a graph representing the attenuation provided in the stop band of the filter according to the application example of Embodiment 1 as the third, fifth, and sixth impedances are varied.

FIG. 9 illustrates a graph representing the attenuation provided in the stop band of the filter 10A according to a typical example of Embodiment 1 as the third impedance, the fifth impedance, and the sixth impedance are varied. Table 1 illustrates data representing specific numerical values of the attenuation. Specifically, FIG. 9 and Table 1 illustrate the attenuation in the Middle and High Bands (1710 to 2690 MHz) serving as the stop band.

Generally, to support CA, for example, an attenuation of 45 dB or more is required in the Middle and High Bands. If a filter provides an attenuation of 45 dB or more, using such a filter in a multiplexer hardly affects loss in the pass band of another filter. As illustrated in Table 1 and FIG. 9, the attenuation is 45.1 dB when the third impedance is 40Ω. Accordingly, to support CA, the third impedance, the fifth impedance, and the sixth impedance can be less than or equal to 40Ω.

Although the operating principle of the present disclosure has been described above with reference to the filter 10A representing a typical example of Embodiment 1 and obtained by connecting the filter 10 according to Embodiment 1 in a plurality of stages (three stages in the above-mentioned example), the operating principle is the same also for a configuration with a single filter 10 alone.

It is to be noted, however, that the configuration including the filter 10 connected in a plurality of stages provides the following effect. That is, the order of the resulting circuit increases, leading to improved attenuation. Further, the interconnect line connecting a parallel-arm resonator with the corresponding switch in each parallel arm has an impedance lower than at least one of the first impedance and the second impedance. This helps reduce the amplitude of the standing wave generated in the stop band located on the higher side of the pass band, thus further improving the attenuation characteristics on the higher side of the pass band.

[4. Method for Lowering Third Impedance]

As described above with reference to FIG. 4, by providing the interconnect line a3 in or on the SW power supply layer to thereby reduce the distance between the interconnect line a3 and ground, the third impedance can be lowered. The method for lowering the third impedance is not limited to the above-mentioned method.

For example, the impedance of an interconnect line decreases as the diameter of a via-hole constituting the interconnect line increases.

Figure 10:
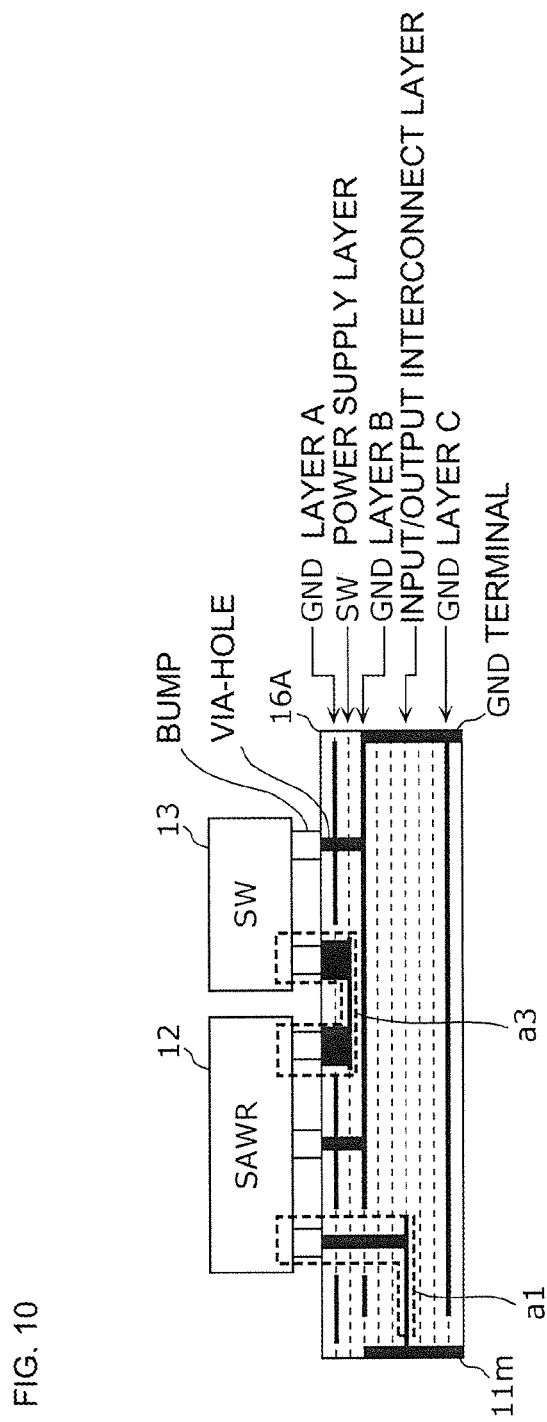
FIG. 10 illustrates another example of various layers of a wiring board on which chips constituting the filter according to Embodiment 1 are mounted.

FIG. 10 illustrates another example of various layers of a wiring board 16A on which the chips 12 and 13 constituting the filter 10 according to Embodiment 1 are mounted.

In the wiring board 16A, the via-hole constituting a portion of the interconnect line a3 has a large diameter as compared with the wiring board 16 illustrated in FIG. 4. As illustrated in FIG. 10, the via-hole constituting a portion of the interconnect line a3 is larger in diameter than the via-hole constituting a portion of the interconnect line a1 and the via-hole (not illustrated) constituting the interconnect line a2. The larger the diameter of a via-hole, the lower the impedance of an interconnect line formed by the via-hole. Consequently, the third impedance of the interconnect line a3 is lower than the first impedance of the interconnect line a1 and the second impedance of the interconnect line a2.

Further, the impedance of an interconnect line decreases with increasing width (line width) of the interconnect line. Therefore, by making the interconnect line a3 have a width (e.g., 50 μm or more) greater than the width of each of the interconnect lines a1 and a2 (e.g., 30 μm), the third impedance can be made lower than the first impedance and the second impedance.

Further, the impedance of an interconnect line decreases with increasing dielectric constant of the interconnect line. Therefore, by making the dielectric constant in the vicinity of the interconnect line a3 greater than the dielectric constant in the vicinity of each of the interconnect lines a1 and a2, the third impedance can be made lower than the first impedance and the second impedance.

As described above, by appropriately designing the location of the interconnect line a3 relative to the GND layer or the power supply layer, the width (shape) of the interconnect line a3, the diameter of the via-hole constituting the interconnect line a3, or the dielectric constant of the interconnect line a3, the third impedance is made lower than at least one of the first impedance and the second impedance.

[5. Reduction of Degradation in Steepness (Sharpness) on Lower Side of Pass Band]

As described above, the interconnect line a3 is an interconnect line that connects the parallel-arm resonator p1 with the switch SW1. When the switch SW1 is ON, the interconnect line a3 functions as an inductor connected in series with the parallel-arm resonator p1. Consequently, an increase in the length of the interconnect line a3 results in an increase in inductance. This causes the resonant frequency of the first parallel-arm resonant circuit to shift lower, leading to degradation of steepness (sharpness) on the lower side of the pass band of the filter 10. Therefore, the interconnect line a3 can be designed to have a small length. Specifically, the interconnect line a3 can be positioned in an upper portion (e.g., closer to the chip-mounting side) of the wiring board 16, for example, above the middle position in the direction of thickness of the wiring board 16. By contrast, since the interconnect lines a1 and a2 need to be connected to the input/output terminals 11m and 11n positioned in a lower portion of the wiring board 16 or on the bottom side of the wiring board 16, the interconnect lines a1 and a2 can be positioned in a lower portion of the wiring board 16 and can be positioned below the interconnect line a3.

As described above, by positioning the interconnect line a3 in an upper portion of the wiring board 16 and positioning the interconnect lines a1 and a2 in a lower portion of the wiring board 16, degradation in steepness (sharpness) on the lower side of the pass band of the filter 10 can be reduced.

[6. Advantages Etc.]

As described above, if the third impedance of the interconnect line a3 is high, a standing wave occurs as a result of impedance mismatch with the parallel-arm resonator p1. The higher the third impedance, the greater the amplitude of the resulting standing wave, leading to degradation of attenuation characteristics in the stop band located on the higher side of the pass band of the filter 10 (acoustic wave filter device). By contrast, if the third impedance is set lower than at least one of the first impedance and the second impedance, the amplitude of the standing wave decreases. This makes it possible to improve the attenuation characteristics on the higher side of the pass band.

For example, the first impedance and the second impedance can be 50Ω in conformity with the normalized impedance of the filter 10, and the third impedance can be lower than both the first impedance and the second impedance. This helps improve the attenuation characteristics in the stop band located on the higher side of the pass band while minimizing an increase in loss in the pass band.

The third impedance can be lower than or equal to 40Ω. This ensures that an attenuation of 45 dB or more can be achieved as an attenuation required in the High and Middle Bands to support CA.

Modification of Embodiment 1

In Embodiment 1 mentioned above, the filter 10 has first bandpass characteristics in which the pole (attenuation pole) on the lower side of the pass band is determined by the resonant frequency of the parallel-arm resonator p1. Alternatively, the first bandpass characteristics may be those subject to the influence of an inductor. A filter having such first bandpass characteristics will be described below as a filter according to a modification of Embodiment 1.

Figure 11A:
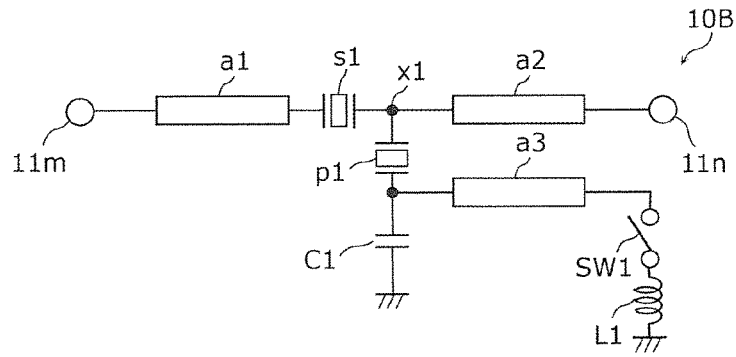
FIG. 11A illustrates the circuit configuration of a filter according to a modification of Embodiment 1.

FIG. 11A illustrates the circuit configuration of a filter 10B according to a modification of Embodiment 1.

As compared with the filter 10 illustrated in FIG. 1, the filter 10B in FIG. 11A further includes an inductor L1 (first inductor element) located on a path that connects the connecting node of the parallel-arm resonator p1 and the capacitor C1 with ground via the switch SW1. The presence of the inductor L1 in the filter 10B increases the amount by which the attenuation pole on the lower side of the pass band shifts lower upon switching of the switch SW1 from OFF to ON.

Figure 11B:
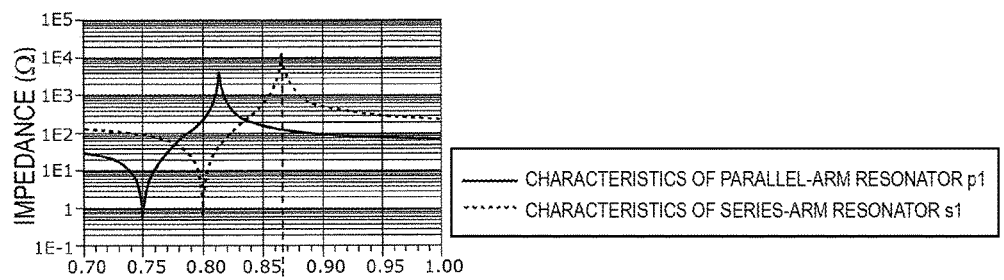
FIGS. 11BA-11BC illustrate graphs representing the characteristics of the filter according to the modification of Embodiment 1.
Figure 11B:
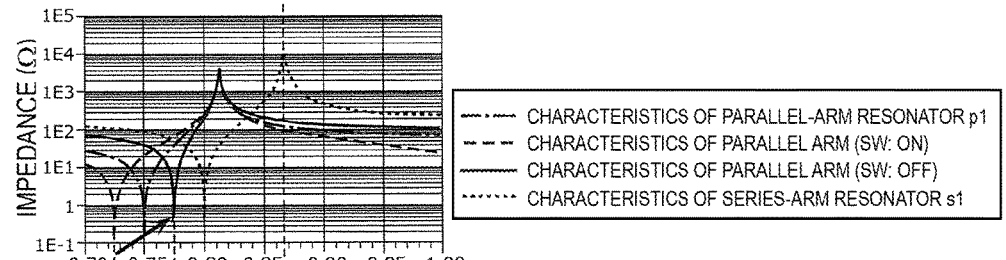
Figure 11B:
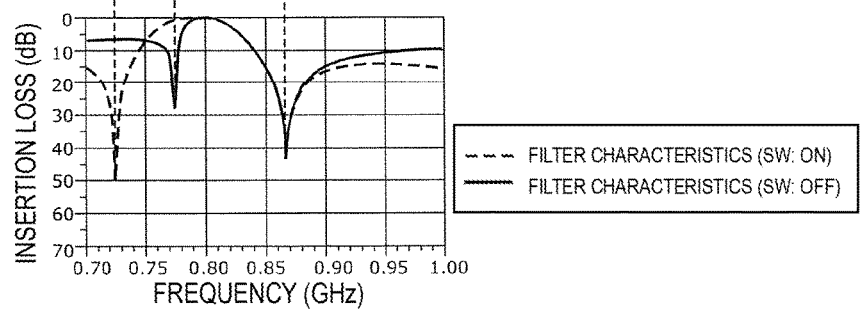

FIGS. 11BA-11BC illustrate graphs representing the characteristics of the filter 10B according to the modification of Embodiment 1. Specifically, the graph in FIG. 11BA represents the impedance characteristics of each resonator alone (each of the parallel-arm resonator p1 and the series-arm resonator s1). The graph in FIG. 11BB compares the impedance characteristics of the first parallel-arm resonant circuit between the ON and OFF states of the switch SW. The impedance characteristics of the parallel-arm resonator p1 alone, and the impedance characteristics of the series-arm resonator s1 are also illustrated in FIG. 11BB. The graph in FIG. 11BC compares the filter characteristics between the ON and OFF states of the switch SW.

In the ON state of the switch SW1, the impedance characteristics of the first parallel-arm resonant circuit are subject to the influence of the inductor L1. That is, in this state, the combined characteristics of the parallel-arm resonator p1 and the inductor L1 represent the impedance characteristics of the first parallel-arm resonant circuit. At this time, the filter 10A has first bandpass characteristics in which the pass band is determined by the anti-resonant frequency of the first parallel-arm resonant circuit and the resonant frequency of the series-arm resonator s1, the pole (attenuation pole) on the lower side of the pass band is determined by the resonant frequency of the first parallel-arm resonant circuit, and the pole (attenuation pole) on the higher side of the pass band is determined by the anti-resonant frequency of the series-arm resonator s1.

By contrast, in the OFF state of the switch SW1, the impedance characteristics of the first parallel-arm resonant circuit are subject to the influence of the capacitor C1. That is, in this state, the combined characteristics of the parallel-arm resonator p1 and the capacitor C1 represent the impedance characteristics of the first parallel-arm resonant circuit.

When the switch SW1 is in an ON state, the resonant frequency of the first parallel-arm resonant circuit shifts lower due to the influence of the inductor L1, and when the switch SW1 is in an OFF state, the resonant frequency of the first parallel-arm resonant circuit shifts higher due to the influence of the capacitor C1. That is, as indicated by the solid arrow in FIG. 11BB, for the impedance characteristics of the first parallel-arm resonant circuit, switching of the switch SW1 from ON to OFF causes a large upward shift in the resonant frequency of the first parallel-arm resonant circuit. This helps increase the amount of shift of the pass band of the filter 10A.

With the filter 10B configured as described above, as in Embodiment 1, the attenuation characteristics can be improved due to the third impedance being lower than at least one of the first impedance and the second impedance. That is, the filter 10B configured as described above constitutes a tunable filter that provides improved attenuation characteristics on the higher side of the pass band.

Embodiment 2

The filter (acoustic wave filter device) according to each of Embodiment 1 and its modification is a tunable filter with a tunable pass band. As a filter according to Embodiment 2, application examples of such a tunable filter will be described with reference to Application Examples 1 to 4.

Application Example 1

Figure 12A:
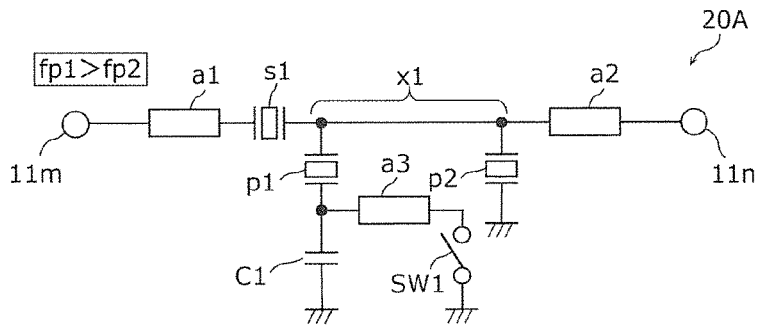
FIG. 12A illustrates the circuit configuration of a filter according to Application Example 1 of Embodiment 2.

FIG. 12A illustrates the circuit configuration of a filter 20A according to Application Example 1 of Embodiment 2.

As compared with the filter 10 illustrated in FIG. 1, the filter 20A in FIG. 12A further includes a second parallel-arm resonant circuit connected between the node x1 and ground and in parallel with the first parallel-arm resonant circuit. The second parallel-arm resonant circuit includes a parallel-arm resonator p2 (second parallel-arm resonator) connected to the node x1. The resonant frequency of the parallel-arm resonator p1 (referred to as fp1 hereinafter) differs from the resonant frequency of the parallel-arm resonator p2 (referred to as fp2 hereinafter). In Application Example 1, fp1 is higher than fp2. An impedance element may be connected between the node x1 and the parallel-arm resonator p2.

With the filter 20A illustrated in FIG. 12A, the frequency at which the impedance has a local minimum and the frequency at which the impedance has a local maximum both shift lower or higher as the switch SW1 is switched between ON (conducting) and OFF (non-conducting) states.

Figure 12B:
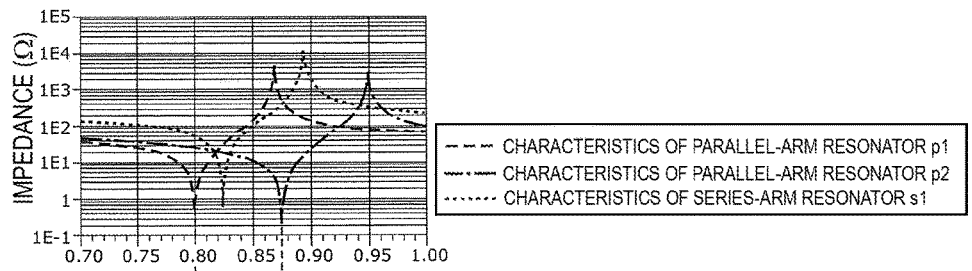
FIGS. 12BA-12BC illustrate graphs representing the characteristics of the filter according to Application Example 1 of Embodiment 2.
Figure 12B:
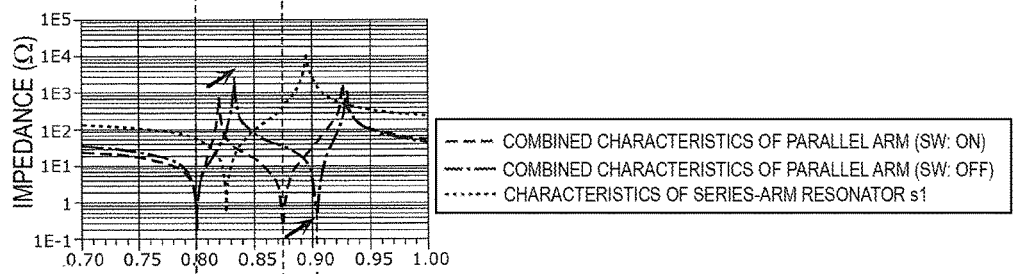
Figure 12B:
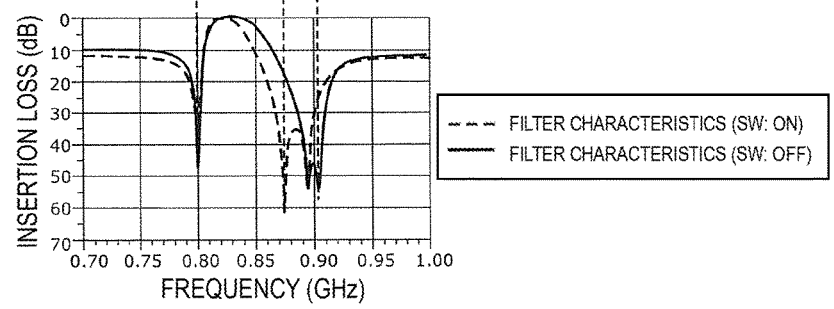

FIGS. 12BA-12BC illustrate graphs representing the characteristics of the filter 20A according to Application Example 1 of Embodiment 2. Specifically, the graph in of FIG. 12BA represents the impedance characteristics of each resonator alone (each of the parallel-arm resonators p1 and p2 and the series-arm resonator s1). The graph in FIG. 12BB compares the combined impedance characteristics (combined characteristics) of the parallel-arm circuit (the circuit made up of the parallel-arm resonators p1 and p2, and the capacitor C1 and the switch SW1 in Application Example 1) between the ON and ON states of the switch SW1. The impedance characteristics of the series-arm resonator s1 are also illustrated in FIG. 12BB. The graph in FIG. 12BC compares the filter characteristics between the ON and OFF states of the switch SW1.

For the convenience of explanation, in the following description, not only for a single resonator used alone and a parallel-arm resonant circuit, but also for a parallel-arm circuit made up of a parallel connection of a plurality of parallel-arm resonant circuits, the singular point at which the combined impedance of the parallel-arm circuit has a local minimum (ideally the point of zero impedance) will be referred to as "resonant frequency". Further, the singular point at which the combined impedance has a local maximum (ideally the point of infinite impedance) will be referred to as "anti-resonant frequency".

When the switch SW1 is in an ON state, the filter 20A has first bandpass characteristics in which the pass band is determined by the lower one of two anti-resonant frequencies of the parallel-arm circuit and the resonant frequency of the series-arm resonator s1, the pole (attenuation pole) on the lower side of the pass band is determined by the resonant frequency of the parallel-arm resonator p1, and the pole (attenuation pole) on the higher side of the pass band is determined by the resonant frequency of the parallel-arm resonator p2 and the anti-resonant frequency of the series-arm resonator s1.

By contrast, when the switch SW1 is in an OFF state, the impedance characteristics of the parallel-arm circuit are subject to the influence of the capacitor C1. That is, in this state, the combined characteristics of the two parallel-arm resonators (the parallel-arm resonators p1 and p2) and the capacitor C1 represent the impedance characteristics of the parallel-arm circuit.

In Application Example 1, when the switch SW1 is OFF, the capacitor C1 is added only to the parallel-arm resonator p1. Consequently, as indicated by the solid arrows in of FIG. 12BB, as the switch SW1 switches from ON to OFF, the impedance characteristics of the parallel-arm circuit (indicated as the combined characteristics of the parallel arm in FIG. 12BB) change as follows. That is, the higher one of the two resonant frequencies and the lower one of the two anti-resonant frequencies both shift higher.

In this regard, the lower anti-resonant frequency of the parallel-arm circuit and the higher resonant frequency of the parallel-arm circuit determine the attenuation slope on the higher side of the pass band of the filter 20A. Therefore, as illustrated in FIG. 12BC, as the switch SW1 switches from ON to OFF, the bandpass characteristics of the filter 20A switch from the first bandpass characteristics to second bandpass characteristics that are shifted higher while maintaining the steepness of the attenuation slope on the higher side of the pass band. In other words, with the filter 20A, as the switch SW1 is switched between conduction and non-conduction, the attenuation pole on the higher side of the pass band can be shifted in frequency while minimizing an increase in insertion loss at the higher end of the pass band.

With the filter 20A configured as described above, as in Embodiment 1, the attenuation characteristics can be improved due to the third impedance being lower than at least one of the first impedance and the second impedance. That is, the filter 20A constitutes a tunable filter having improved attenuation characteristics.

Application Example 2

Figure 13A:
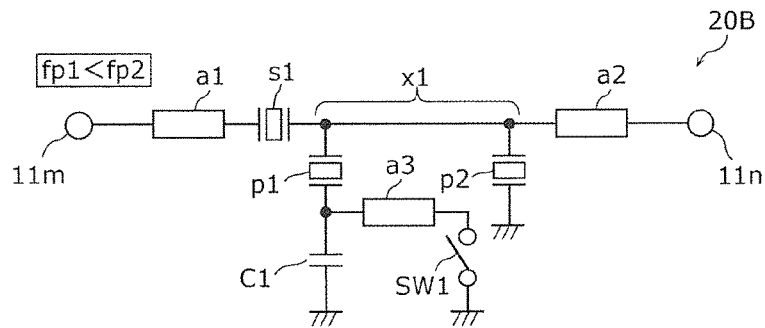
FIG. 13A illustrates the circuit configuration of a filter according to Application Example 2 of Embodiment 2.

FIG. 13A illustrates the circuit configuration of a filter 20B according to Application Example 2 of Embodiment 2.

The filter 20B in FIG. 13 differs from the filter 20A illustrated in FIG. 12A in that fp1 is lower than fp2.

Figure 13B:
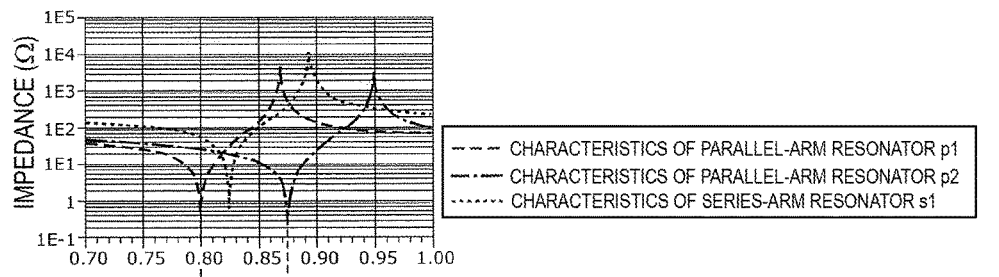
FIGS. 13BA-13BC illustrate graphs representing the characteristics of the filter according to Application Example 2 of Embodiment 2.
Figure 13B:
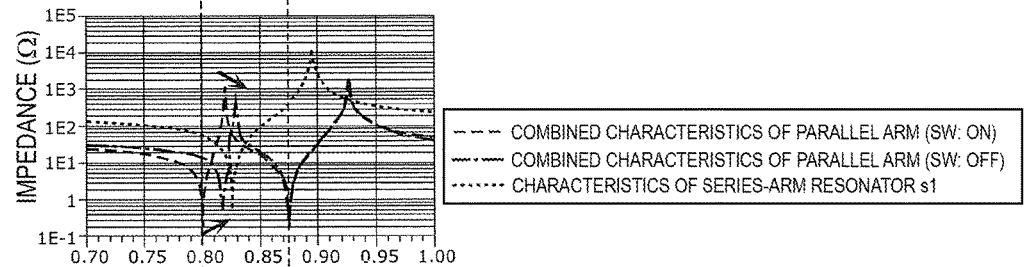
Figure 13B:
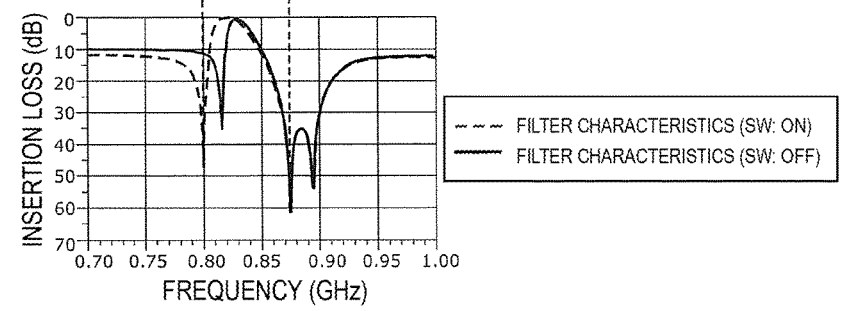

FIGS. 13BA-13BC illustrate graphs representing the characteristics of the filter 20B according to Application Example 2 of Embodiment 2. Specifically, as with the graphs in FIGS. 12BA and 12BB, the graphs in FIGS. 13BA and 13BB represent the impedance characteristics of each resonator alone and the combined impedance characteristics of a parallel-arm circuit. The graph in FIG. 13BC compares the filter characteristics between the ON and OFF states of the switch SW1.

In Application Example 2, when the switch SW1 is OFF, the capacitor C1 is added only to the parallel-arm resonator p1. Consequently, as indicated by the solid arrows in of FIG. 13BB, as the switch SW1 switches from ON to OFF, the impedance characteristics of the parallel-arm circuit (indicated as the combined characteristics of the parallel arm in FIG. 13BB change as follows. That is, the lower one of the two resonant frequencies and the lower one of the two anti-resonant frequencies both shift higher.

In this regard, the lower anti-resonant frequency of the parallel arm circuit and the lower resonant frequency of the parallel arm circuit determine the attenuation slope on the lower side of the pass band of the filter 20B. Therefore, as illustrated in FIG. 13BC, as the switch SW1 switches from ON to OFF, the bandpass characteristics of the filter 20B switch from the first bandpass characteristics to second bandpass characteristics that are shifted higher while maintaining the steepness of the attenuation slope on the lower side of the pass band. In other words, with the filter 20B, as the switch SW1 is switched between conduction and non-conduction, the attenuation pole on the lower side of the pass band can be shifted in frequency while minimizing an increase in insertion loss at the lower end of the pass band.

With the filter 20B configured as described above, as in Embodiment 1, the attenuation characteristics can be improved due to the third impedance being lower than at least one of the first impedance and the second impedance. That is, the filter 20B constitutes a tunable filter having improved attenuation characteristics.

Application Example 3

Figure 14A:
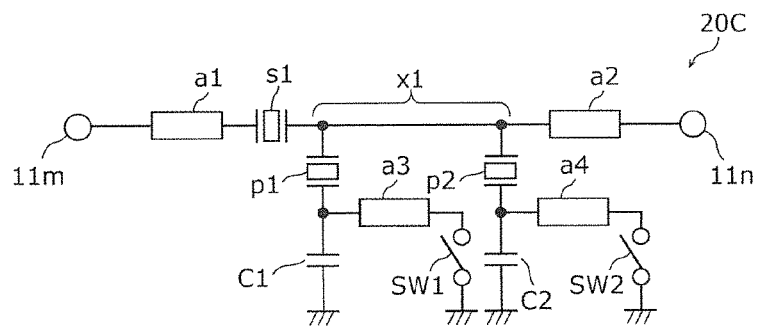
FIG. 14A illustrates the circuit configuration of a filter according to Application Example 3 of Embodiment 2.

FIG. 14A illustrates the circuit configuration of a filter 20C according to Application Example 3 of Embodiment 2.

In the filter 20C, the second parallel-arm resonant circuit further includes a pair of a capacitor C2 (second impedance element) and a switch SW2 (second switch) connected in parallel with each other and in series with the parallel-arm resonator p2 between the parallel-arm resonator p2 and ground. The parallel-arm resonator p2 and the switch SW2 are connected by an interconnect line a4 (fourth interconnect line). The interconnect line a4 has a fourth impedance that is higher than at least one of the first impedance of the interconnect line a1 and the second impedance of the interconnect line a2. In Application Example 3, for example, fp1 is higher than fp2. With the filter 20C in FIG. 14A, the attenuation slope on the higher side of the pass band and the attenuation slope on the lower side of the pass band are both shifted.

Figure 14B:
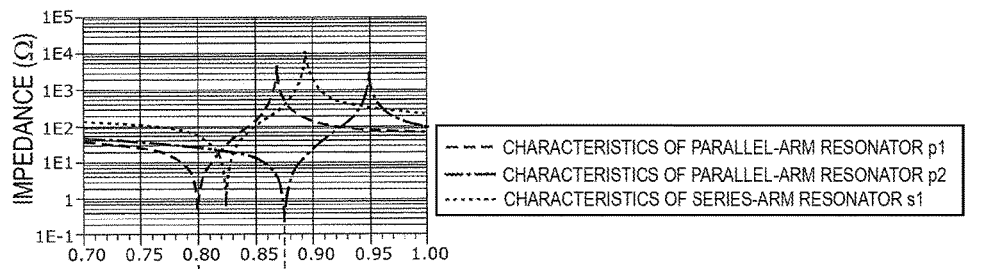
FIGS. 14BA-14BC illustrate graphs representing the characteristics of the filter according to Application Example 3 of Embodiment 2.
Figure 14B:
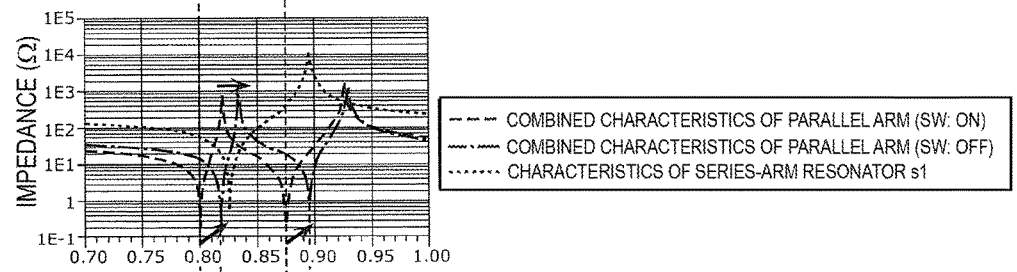
Figure 14B:
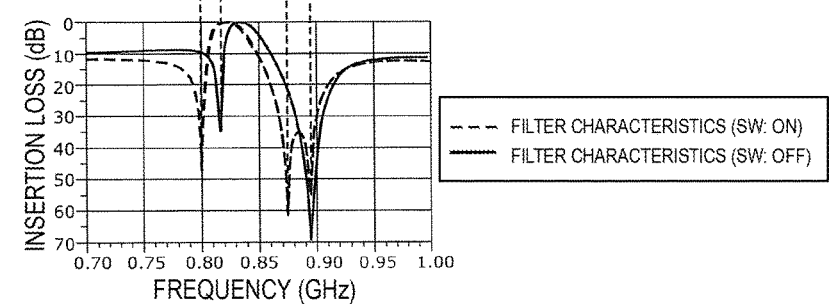

FIGS. 14BA-14BC illustrate graphs representing the characteristics of the filter 20C according to Application Example 3 of Embodiment 2. Specifically, as with the graphs in FIGS. 12BA and 12BB, the graphs in FIGS. 14BA and 14BB represent the impedance characteristics of each resonator alone and the combined impedance characteristics of a parallel-arm circuit (the circuit made up of the parallel-arm resonators p1 and p2, the capacitors C1 and C2, and the switches SW1 and SW2). The graph in FIG. 14BC compares the filter characteristics between when the switches SW1 and SW2 are both ON and when the switches SW1 and SW2 are both OFF.

In Application Example 3, when the switches SW1 and SW2 are both OFF, the capacitor C1 is added to the parallel-arm resonator p1, and the capacitor C2 is added to the parallel-arm resonator p2. Consequently, as indicated by the solid arrows in FIG. 14BB, as the switches SW1 and SW2 both switch from ON to OFF together, the impedance characteristics of the parallel-arm circuit (indicated as the combined characteristics of the parallel arm in FIG. 14BB) change as follows. That is, both of the two resonant frequencies, and the lower one of the two anti-resonant frequencies all shift higher.

Therefore, as illustrated in FIG. 13BC, as the switches SW1 and SW2 both switch from ON to OFF, the bandpass characteristics of the filter 20C switch from the first bandpass characteristics to second bandpass characteristics that are shifted higher while maintaining the steepness of the attenuation slope on each of the lower and higher sides of the pass band. In other words, with the filter 20C, as the switches SW1 and SW2 are switched between conduction and non-conduction, the attenuation pole on each of the higher and lower sides of the pass band can be shifted in frequency while minimizing an increase in insertion loss at each of the higher and lower ends of the pass band. As a result, for example, the center frequency of the filter 20C can be shifted while maintaining the band width.

In the filter 20C, the switches SW1 and SW2 may not be both switched ON/OFF together but may be switched ON/OFF individually. It is to be noted, however, that switching both the switches SW1 and SW2 ON/OFF together makes it possible to reduce the number of control lines for controlling the switches SW1 and SW2. This leads to simplified configuration of the filter 20C.

By contrast, switching these switches ON/OFF individually allows for greater variations of pass bands that can be switched by the filter 20C.

Specifically, since fp1 is higher than fp2, the higher end of the pass band can be tuned by switching between the ON and OFF states of the switch SW1 connected in series with the parallel-arm resonator p1, and the lower end of the pass band can be tuned by switching between the ON and OFF states of the switch SW2 connected in series with the parallel-arm resonator p2.

Therefore, by switching both the switches SW1 and SW2 ON or OFF together, both the lower and higher ends of the pass band can be shifted lower or higher. That is, the center frequency of the pass band can be shifted lower or higher. Further, by switching one of the switches SW1 and SW2 from ON to OFF and switching the other from OFF to ON, both the lower and higher ends of the pass band can be shifted in such a way as to increase or decrease the difference in frequency between the two ends of the pass band. That is, the pass band width can be tuned while keeping the center frequency of the pass band substantially constant. Furthermore, by switching one of the switches SW1 and SW2 between ON and OFF states with the other placed in an ON or OFF state, one of the lower and higher ends of the pass band can be shifted lower or higher while keeping the other fixed. That is, the lower or higher end of the pass band can be tuned.

The presence of the capacitor C2 and the switch SW2 in the second parallel-arm resonant circuit as described above helps increase the degree of freedom in tuning the pass band.

With the filter 20C configured as described above, as in Embodiment 1, the attenuation characteristics can be improved due to the third impedance and the fourth impedance being lower than at least one of the first impedance and the second impedance. That is, the filter 20C constitutes a tunable filter having improved attenuation characteristics. In an alternative configuration, at least one of the third impedance and the fourth impedance may be lower than at least one of the first impedance and the second impedance. In other words, one of the third impedance and the fourth impedance may be higher than at least one of the first impedance and the second impedance.

Application Example 4

Figure 15A:
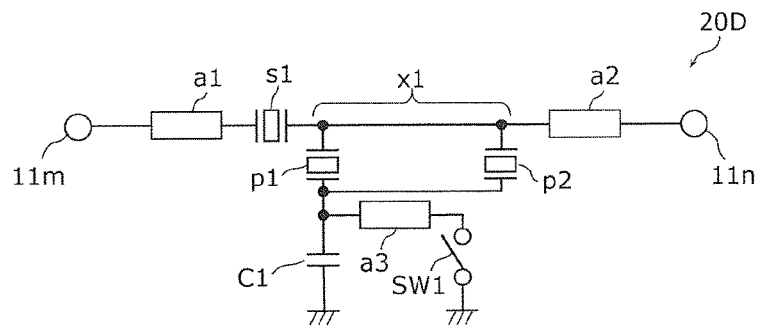
FIG. 15A illustrates the circuit configuration of a filter according to Application Example 4 of Embodiment 2.

FIG. 15A illustrates the circuit configuration of a filter 20D according to Application Example 4 of Embodiment 2.

The filter 20D illustrated in FIG. 15A differs from the filter 20A illustrated in FIG. 12A in that the pair of the capacitor C1 and the switch SW1 connected in parallel with each other is connected in series with the parallel circuit of the parallel-arm resonator p1 and the parallel-arm resonator p2. Further, fp1 differs from fp2. A circuit in which the pair of the capacitor C1 and the switch SW1 connected in parallel with each other is connected in series with the parallel circuit of the parallel-arm resonator p1 and the parallel-arm resonator p2 will be herein referred to as first parallel-arm resonant circuit.

Figure 15B:
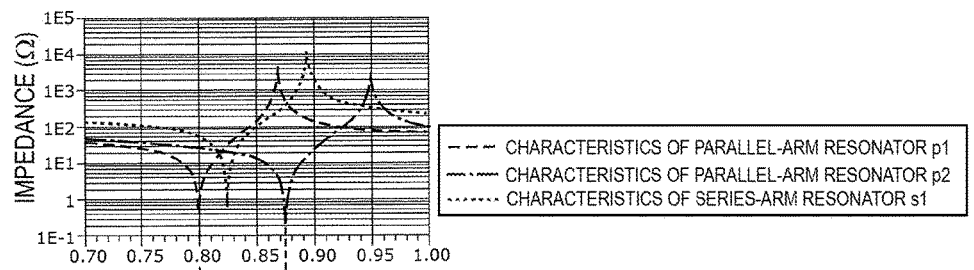
FIGS. 15BA-15BC illustrate graphs representing the characteristics of the filter according to Application Example 4 of Embodiment 2.
Figure 15B:
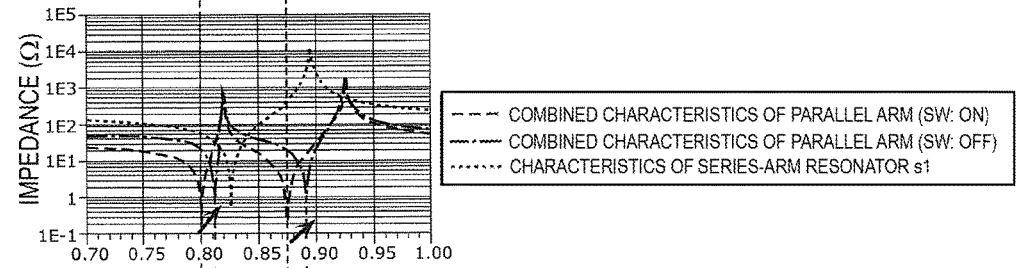
Figure 15B:
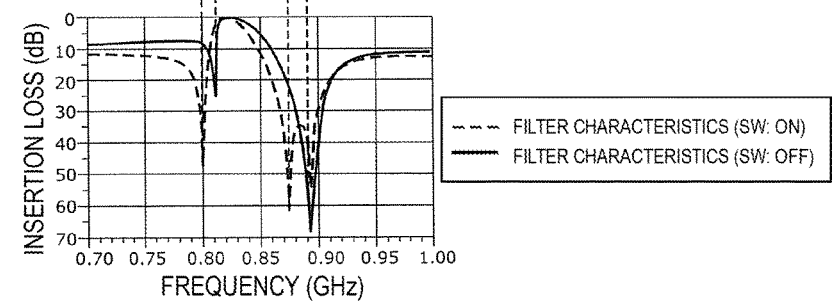

FIGS. 15BA-15BC illustrate graphs representing the characteristics of the filter 20D according to Application Example 4 of Embodiment 2. Specifically, as with the graphs in FIGS. 12BA and BB, the graphs in FIGS. 15BA and 15BB represent the impedance characteristics of each resonator alone and the combined impedance characteristics of the first parallel-arm resonant circuit. The graph in FIG. 15BC compares the filter characteristics between the ON and OFF states of the switch SW1.

In Application Example 4, when the switch SW1 is OFF, the capacitor C1 is added to the parallel connection of the parallel-arm resonators p1 and p2. Consequently, as indicated by the solid arrows in FIG. 15BB, as switch SW1 switches from ON to OFF, the impedance characteristics of the first parallel-arm resonant circuit (indicated as the combined characteristics of the parallel arm in FIG. 15BB change as follows. That is, neither of the two anti-resonant frequencies shifts but both of the two resonant frequencies shift higher.

Therefore, as illustrated in FIG. 15BC, as the switch SW1 switches from ON to OFF, the bandpass characteristics of the filter 20D switches from the first bandpass characteristics to second bandpass characteristics in which the poles (attenuation poles) on both sides of the pass band are both shifted higher relative to the first bandpass characteristics.

With the filter 20D configured as described above, as in Embodiment 1, the attenuation characteristics can be improved due to the third impedance being lower than at least one of the first impedance and the second impedance. That is, the filter 20D constitutes a tunable filter having improved attenuation characteristics.

Embodiment 3

The filter (acoustic wave filter device) described above with reference to each of Embodiments 1 to 2 can be applied to, for example, an RF front-end circuit. The following description of Embodiment 3 will be directed to a configuration of such an RF front-end circuit including the filter 10 described above with reference to Embodiment 1.

Figure 16:
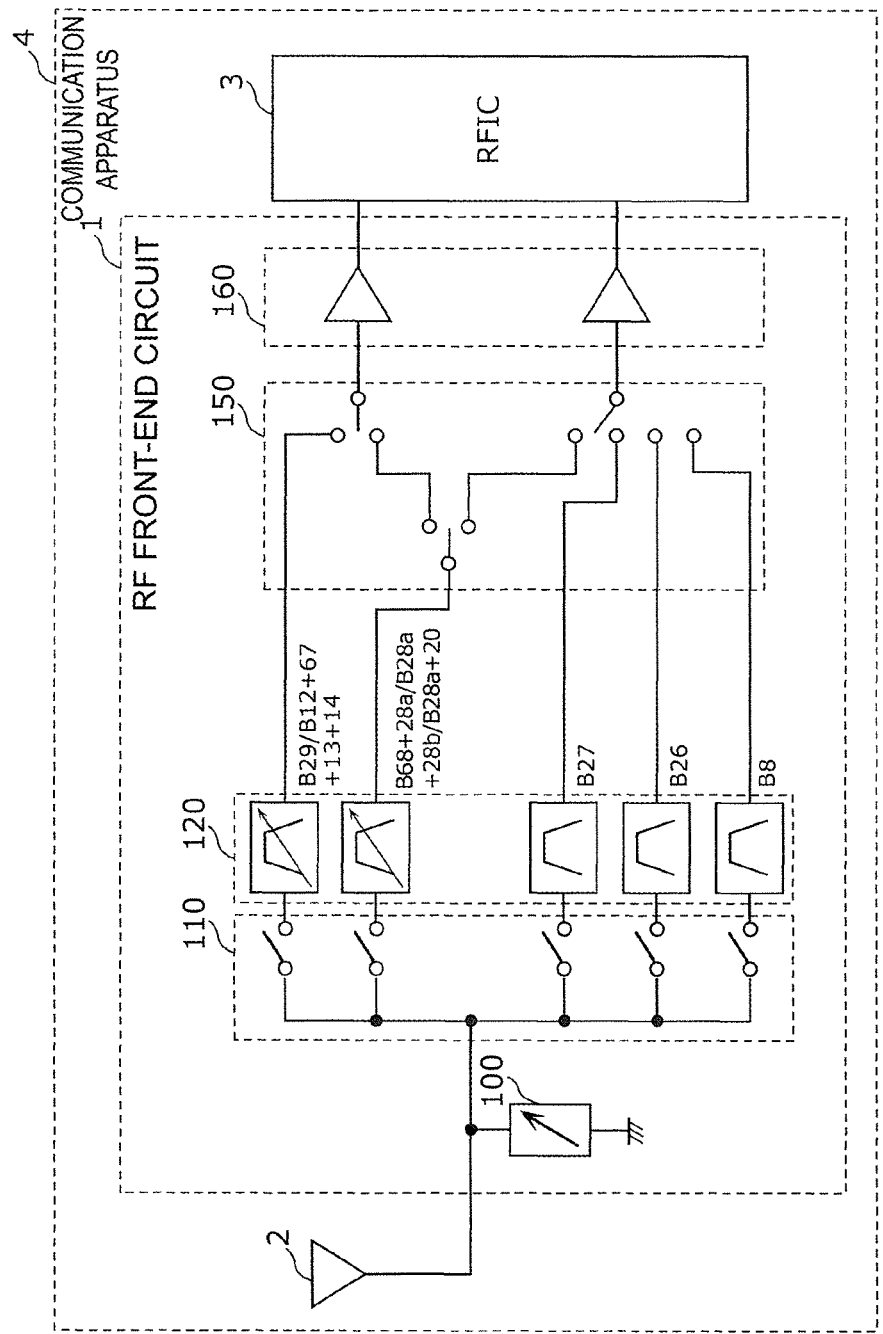
FIG. 16 illustrates the configuration of an RF front-end circuit according to Embodiment 3 and its peripheral circuitry.

FIG. 16 illustrates the configuration of an RF front-end circuit 1 according to Embodiment 3 and its peripheral circuitry. FIG. 16 illustrates the RF front-end circuit 1, an antenna element 2, and an RF integrated circuit (RFIC) 3. The RF front-end circuit 1 and the RFIC 3 constitute a communication apparatus 4. The antenna element 2, the RF front-end circuit 1, and the RFIC 3 are disposed, for example, at the front-end section of a multimode/multiband-capable cellular phone.

The antenna element 2 is a multiband-capable antenna that transmits and receives an RF signal and is compliant with a communication standard such as LTE. The antenna element 2 may not support all the bands of the communication apparatus 4 but may support only a group of lower frequency bands or a group of higher frequency bands. The antenna element 2 may not be incorporated in the communication apparatus 4 but may be disposed separately from the communication apparatus 4.

The RFIC 3 is an RF integrated circuit that processes an RF signal transmitted and received by the antenna element 2. Specifically, the RFIC 3 applies signal processing such as down-conversion to an RF signal (which in this case is an RF receive signal) input to the RFIC 3 from the antenna element 2 via the receive-side signal path of the RF front-end circuit 1, and outputs a receive signal generated through this signal processing to a baseband integrated circuit (not illustrated). Further, the RFIC 3 applies signal processing such as up-conversion to a transmit signal input from the baseband integrated circuit, and outputs an RF signal (which in this case is an RF transmit signal) generated through this signal processing to the transmit-side signal path (not illustrated) of the RF front-end circuit 1.

The RF front-end circuit 1 is a circuit that transmits an RF signal between the antenna element 2 and the RFIC 3. Specifically, the RF front-end circuit 1 transmits an RF signal (which in this case is an RF receive signal) received by the antenna element 2 to the RFIC 3 via the receive-side signal path.

The RF front-end circuit 1 includes the following components disposed in the order stated below as viewed from the antenna element 2: a variable impedance matching circuit 100, a group of switches 110, a group of filters 120, a group of switches 150, and a group of receiving amplifier circuits 160.

The group of switches 110 includes one or more switches (a plurality of switches in Embodiment 3) that, in accordance with a control signal from a controller (not illustrated), connect the antenna element 2 to a filter corresponding to a predetermined band. The antenna element 2 may not necessarily be connected to a single filter but may be connected to a plurality of filters.

The group of filters 120 includes one or more filters. In Embodiment 3, the group of filters 120 includes, for example, first to fifth filters described below. Specifically, the first filter is a tunable filter capable of supporting one of Band 29 and Bands 12, 67, 13, and 14. The second filter is a tunable filter capable of supporting one of the following CAs: CA of Bands 68 and 28a; CA of Bands 28a and 28b; and CA of Bands 28a and 20. The filter 10 described above with reference to Embodiment 1 can be employed as the second filter. The third to fifth filters are filters each having a fixed pass band. The third filter corresponds to Band 27, the fourth filter corresponds to Band 26, and the fifth filter corresponds to Band 8.

The group of switches 150 includes one or more switches (a plurality of switches in Embodiment 3) that, in accordance with a control signal from a controller (not illustrated), connect a filter corresponding to a predetermined band to a receiving amplifier circuit corresponding to the predetermined band among the group of receiving amplifier circuits 160. Not only a single filter but also a plurality of filters may be connected to the receiving amplifier circuit mentioned above.

The group of receiving amplifier circuits 160 includes one or more low-noise amplifiers (a plurality of low-noise amplifiers in Embodiment 3) that amplify the power of an RF receive signal input from the group of switches 150.

In the RF front-end circuit 1 configured as described above, an RF signal (which in this case is an RF receive signal) input from the antenna element 2 is filtered by a predetermined filter, and then amplified by a predetermined low-noise amplifier before being output to the RFIC 3. An RFIC corresponding to the Low Band and an RFIC corresponding to the High Band may be provided individually.

The RF front-end circuit 1 includes, as a second filter (tunable filter), the filter 10 described above with reference to Embodiment 1. As described above with reference to Embodiment 1, in the filter 10, the third impedance is set lower than at least one of the first impedance and the second impedance. Consequently, the RF front-end circuit 1 including the filter 10 configured as described above makes it possible to improve the attenuation characteristics in the stop band located on the higher side of the pass band. For example, the above-mentioned stop band corresponds to the Middle and High Bands (1710 to 2690 MHz).

As described above, the RF front-end circuit 1 includes the filter 10 (tunable filter) described above with reference to Embodiment 1. As compared with when the RF front-end circuit 1 is provided with a filter having a fixed pass band, this configuration helps reduce the number of filters, thus enabling miniaturization.

The RF front-end circuit 1 may include the filter 10 as a first filter (tunable filter).

The foregoing description of Embodiment 3 is directed to the RF front-end circuit 1 having a reception diversity configuration with a plurality of filters (receiving filters) provided on the receive-side signal path. However, the configuration of the RF front-end circuit is not limited to this configuration but may be a transmission diversity configuration with a plurality of filters (transmitting filters) provided on the transmit-side signal path. Further, the configuration of the RF front-end circuit is not limited to a diversity configuration with a plurality of receiving filters or a plurality of transmitting filters. Alternatively, the configuration of the RF front-end circuit may be a configuration with only a single receiving filter or a single transmitting filter or may be a configuration designed for both transmission and reception with at least one transmitting filter and at least one receiving filter.

OTHER EMBODIMENTS

Although exemplary embodiments of an acoustic wave filter device and an RF front-end circuit according to the present disclosure have been described above by way of Embodiments 1 to 3, the present disclosure is not limited to the above embodiments. The present disclosure is intended to encompass other embodiments achieved by combining given components in the above embodiments, modifications obtained by modifying the above embodiments in various ways as may become apparent to one skilled in the art without departing from the scope of the present disclosure, and various apparatuses incorporating the acoustic wave filter device and the RF front-end circuit according to the present disclosure.

For example, the present disclosure also encompasses the communication apparatus 4 including the RF front-end circuit 1 and the RFIC 3. The communication apparatus 4 configured as described above makes it possible to improve attenuation characteristics.

The present disclosure also encompasses a multiplexer including the above-mentioned filter, such as a duplexer. That is, for a multiplexer including a plurality of filters with their respective one terminals connected together to form a common terminal, at least one filter may be one of the filters described above.

In the above-mentioned embodiments, a case in which the third impedance of the interconnect line a3 is lower than both the first impedance of the interconnect line a1 and the second impedance of the interconnect line a2, which are set to 50Ω, has been described as an exemplary case in which the third impedance is lower than at least one of the first impedance and the second impedance. However, this is not to be construed restrictively. For example, the first impedance and the second impedance may not be 50Ω, and the third impedance may be lower than the higher one of the first impedance and the second impedance.

Although the foregoing description of Embodiment 3 is directed to an exemplary case in which the third impedance of the interconnect line a3 is lower than at least one of the first impedance of the interconnect line a1 and the second impedance of the interconnect line a2, this is not to be construed restrictively. For example, the impedances of interconnect lines (the fifth impedance of the interconnect line a5 and the sixth impedance of the interconnect line a6), each connecting a parallel-arm resonator with the corresponding switch in each of at least one parallel-arm resonant circuit may be lower than at least one of the first impedance and the second impedance. That is, of the impedances of interconnect lines each connecting a parallel-arm resonator with the corresponding switch in each parallel arm of the filter 30, at least one impedance (can be all of the impedances) may be lower than at least one of the first impedance and the second impedance. For example, if the impedances of interconnect lines each connecting a parallel-arm resonator with the corresponding switch in each parallel arm of the filter 10 are all set lower than at least one of the first impedance and the second impedance, the attenuation characteristics in the stop band located on the higher side of the pass band can be further improved.

Some or all of the above-mentioned resonators may not necessarily be formed as acoustic wave resonators employing surface acoustic waves but may be formed as, for example, acoustic wave resonators employing bulk acoustic waves or boundary acoustic waves. That is, some or all of the above-mentioned resonators may not be formed by IDT electrodes. An acoustic wave filter device with such a resonator also makes it possible to improve attenuation characteristics.

In another exemplary configuration, in the RF front-end circuit or the communication apparatus, an inductor or capacitor may be connected between individual components. The inductor may include an interconnect inductor due to an interconnect line connecting individual components with each other.

INDUSTRIAL APPLICABILITY

Possible applications of the present disclosure include a filter, a multiplexer, a front-end circuit, and a communication apparatus that are compact and adaptable to multiband systems and designed for use in a wide variety of communication units such as cellular phones.

REFERENCE SIGNS LIST

1 RF front-end circuit
2 antenna element
3 RF integrated circuit (RFIC)
4 communication apparatus
10, 10A, 20A to 20D filter (acoustic wave filter device)
11m input/output terminal (first input/output terminal)
11n input/output terminal (second input/output terminal)
12 to 15 chip
16, 16A wiring board
101 IDT electrode
101a, 101b comb electrode
101g adhesion layer
101h main electrode layer
102 substrate having piezoelectric property
103 protective layer
110a, 110b electrode fingers
111a, 111b busbar electrode
110, 150 group of switches
120 group of filters
160 group of receiving amplifier circuits
a1 to a6 interconnect line
C1 to C4 capacitor (impedance element)
L1 inductor (first inductor element)

p1 to p4 parallel-arm resonator
s1 to s3 series-arm resonator (series-arm resonant circuit)
SW1 to SW4 switch (switching element)

The invention claimed is:

1. A frequency-tunable acoustic wave filter, comprising:
a series-arm resonant circuit connected on a path that connects a first input/output terminal with a second input/output terminal; and
a first parallel-arm resonant circuit connected between a first node and ground, the first node being located on the path,
wherein the first parallel-arm resonant circuit includes
a first parallel-arm resonator, and
a pair of a first impedance element and a first switch connected in parallel with each other and in series with the first parallel-arm resonator between the first parallel-arm resonator and ground,
wherein a first interconnect line is connected to the first input/output terminal on the path, the first interconnect line having a first characteristic impedance,
wherein a second interconnect line is connected to the second input/output terminal on the path, the second interconnect line having a second characteristic impedance,
wherein the first parallel-arm resonator and the first switch are connected by a third interconnect line having a third characteristic impedance, and
wherein the third characteristic impedance is lower than at least one of the first characteristic impedance and the second characteristic impedance.

2. The frequency-tunable acoustic wave filter device according to claim 1,
wherein the third characteristic impedance is lower than both the first characteristic impedance and the second characteristic impedance.

3. The frequency-tunable acoustic wave filter device according to claim 1,
wherein the third characteristic impedance is less than or equal to 40Ω.

4. The frequency-tunable acoustic wave filter device according to claim 1, further comprising
a wiring board,
wherein a portion of at least one of the first interconnect line, the second interconnect line, and the third interconnect line is disposed on the wiring board or inside the wiring board.

5. The frequency-tunable acoustic wave filter device according to claim 4,
wherein the first parallel-arm resonator and the first switch are disposed on the wiring board or inside the wiring board.

6. The frequency-tunable acoustic wave filter device according to claim 4,
wherein the third interconnect line is provided in or on a layer provided with a control interconnect line, or in or on a layer provided with a power supply interconnect line, the control interconnect line connecting the first switch with a control circuit that controls the first switch, the power supply interconnect line connecting the first switch with a power supply circuit that drives the first switch.

7. The frequency-tunable acoustic wave filter device according to claim 4, further comprising
a first inductor element located on a path that connects a second node with ground via the first switch, the second node being connected to the first parallel-arm resonator and the first impedance element.

8. The frequency-tunable acoustic wave filter device according to claim 4,
wherein the first parallel-arm resonant circuit further includes a second parallel-arm resonator connected in parallel with the first parallel-arm resonator,
wherein the pair of the first impedance element and the first switch connected in parallel with each other is connected in series with a circuit formed by a parallel connection of the first parallel-arm resonator and the second parallel-arm resonator, and
wherein the first parallel-arm resonator has a resonant frequency different from a resonant frequency of the second parallel-arm resonator.

9. The frequency-tunable acoustic wave filter device according to claim 1, further comprising
a first inductor element located on a path that connects a second node with ground via the first switch, the second node being connected to the first parallel-arm resonator and the first impedance element.

10. The frequency-tunable acoustic wave filter device according to claim 1, further comprising
a second parallel-arm resonant circuit connected between the first node and ground and in parallel with the first parallel-arm resonant circuit,
wherein the second parallel-arm resonant circuit includes a second parallel-arm resonator, and
wherein the first parallel-arm resonator has a resonant frequency different from a resonant frequency of the second parallel-arm resonator.

11. The frequency-tunable acoustic wave filter device according to claim 10,
wherein the first parallel-arm resonator has a resonant frequency higher than a resonant frequency of the second parallel-arm resonator.

12. The frequency-tunable acoustic wave filter device according to claim 10,
wherein the first parallel-arm resonator has a resonant frequency lower than a resonant frequency of the second parallel-arm resonator.

13. The frequency-tunable acoustic wave filter device according to claim 10,
wherein the second parallel-arm resonant circuit further includes a pair of a second impedance element and a second switch connected in parallel with each other and in series with the second parallel-arm resonator between the second parallel-arm resonator and ground.

14. The frequency-tunable acoustic wave filter device according to claim 13,
wherein the second parallel-arm resonator and the second switch are connected by a fourth interconnect line having a fourth characteristic impedance, and
wherein the fourth characteristic impedance is lower than at least one of the first characteristic impedance and the second characteristic impedance.

15. The frequency-tunable acoustic wave filter device according to claim 1,
wherein the first parallel-arm resonant circuit further includes a second parallel-arm resonator connected in parallel with the first parallel-arm resonator,
wherein the pair of the first impedance element and the first switch connected in parallel with each other is connected in series with a circuit formed by a parallel connection of the first parallel-arm resonator and the second parallel-arm resonator, and
wherein the first parallel-arm resonator has a resonant frequency different from a resonant frequency of the second parallel-arm resonator.

16. The frequency-tunable acoustic wave filter device according to claim 1, further comprising
at least one third parallel-arm resonant circuit connected to a third node located on the path that connects the first input/output terminal with the second input/output terminal, the third node being different from the first node,
wherein the at least one third parallel-arm resonant circuit includes
a third parallel-arm resonator, and
a pair of a third impedance element and a third switch connected in parallel with each other and in series with the third parallel-arm resonator between the third parallel-arm resonator and ground.

17. The frequency-tunable acoustic wave filter device according to claim 16,
wherein the third impedance, and a fifth characteristic impedance of a fifth interconnect line connecting the third parallel-arm resonator with the third switch in the at least one third parallel-arm resonant circuit are both lower than at least one of the first characteristic impedance and the second characteristic impedance.

18. An RF front-end circuit comprising:
the frequency-tunable acoustic wave filter device according to claim 1; and
an amplifier circuit connected to the frequency-tunable acoustic wave filter device.

19. A communication apparatus comprising:
an RF integrated circuit that processes an RF signal transmitted and received by an antenna element; and
the RF front-end circuit according to claim 18, the RF front-end circuit transmitting the RF signal between the antenna element and the RF integrated circuit.

20. The frequency-tunable acoustic wave filter device according to claim 1, wherein the series-arm resonant circuit and the first parallel-arm resonant circuit are provided on a first chip, and the first switch is provided on a second chip different from the first chip.

* * * * *